US012645019B2

(12) United States Patent
Koito et al.

(10) Patent No.: US 12,645,019 B2
(45) Date of Patent: Jun. 2, 2026

(54) OPTICAL FILM, OPTICAL LAMINATE, AND IMAGE DISPLAY DEVICE

(71) Applicant: FUJIFILM Corporation, Tokyo (JP)

(72) Inventors: Naoki Koito, Kanagawa (JP); Naoya Shibata, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 506 days.

(21) Appl. No.: 18/307,639

(22) Filed: Apr. 26, 2023

(65) Prior Publication Data

US 2023/0288623 A1 Sep. 14, 2023

Related U.S. Application Data

(63) Continuation of application No. PCT/JP2021/039670, filed on Oct. 27, 2021.

(30) Foreign Application Priority Data

Oct. 28, 2020 (JP) ................................ 2020-180329
Oct. 25, 2021 (JP) ................................ 2021-173733

(51) Int. Cl.
*G02B 5/30* (2006.01)
*H10K 59/80* (2023.01)

(52) U.S. Cl.
CPC ......... *G02B 5/3016* (2013.01); *G02B 5/3083* (2013.01); *H10K 59/8793* (2023.02); *H10K 59/8791* (2023.02)

(58) Field of Classification Search
CPC ...... G02B 5/3016; G02B 5/3083; G02B 5/22; G02B 5/223; G02B 1/11; G02B 1/111;
(Continued)

(56) References Cited

U.S. PATENT DOCUMENTS

2011/0234953 A1 9/2011 Amimori et al.
2015/0153495 A1* 6/2015 Matsuda ................. B05D 5/06 427/163.1
(Continued)

FOREIGN PATENT DOCUMENTS

CN 102200601 A 9/2011
JP 2001-159713 A 6/2001
(Continued)

OTHER PUBLICATIONS

Office Action, issued by the Japanese Patent Office on Feb. 18, 2025, in connection with Japanese Patent Application No. 2022-559201.
(Continued)

*Primary Examiner* — Angela M. Medich
(74) *Attorney, Agent, or Firm* — Edwards Neils LLC; Jean C. Edwards, Esq.

(57) ABSTRACT

Provided is an optical film and an optical laminate that achieve an image display device capable of an antireflection effect of external light and improvement of utilization efficiency of light emitted by a light emitting element when applied to a self-emission type image display device formed of an inorganic EL element, an organic EL element, or the like. The optical film includes a light absorption anisotropic film consisting of a cured substance of a liquid crystal composition that contains a polymerizable liquid crystal compound and a dichroic coloring agent compound, in which the light absorption anisotropic film has, in the same film surface, regions A and B where an inclination of an absorption axis with respect to a film surface is θA and θB, respectively, and θA and θB satisfy relationships of Expressions (1) $|\theta A-\theta B|\geq 10°$ and (2) $0°\leq\theta B\leq 5°$.

20 Claims, 12 Drawing Sheets

(58) Field of Classification Search
CPC ............... G02B 1/115; H10K 59/8793; H10K 59/8792; H10K 59/8791
See application file for complete search history.

(56) References Cited

U.S. PATENT DOCUMENTS

| | | | | |
|---|---|---|---|---|
| 2015/0177435 | A1 | 6/2015 | Kim et al. | |
| 2016/0334633 | A1* | 11/2016 | Asanoi | E06B 9/24 |
| 2019/0072701 | A1 | 3/2019 | Murashige et al. | |
| 2020/0411609 | A1 | 12/2020 | Yonemoto | |
| 2021/0302773 | A1 | 9/2021 | Koito et al. | |

FOREIGN PATENT DOCUMENTS

| | | | |
|---|---|---|---|
| JP | 2002-357720 | A | 12/2002 |
| JP | 2004-004149 | A | 1/2004 |
| JP | 2006-267812 | A | 10/2006 |
| JP | 2009-193014 | A | 8/2009 |
| JP | 2009-259721 | A | 11/2009 |
| JP | 2010-060516 | A | 3/2010 |
| JP | 2011-158574 | A | 8/2011 |
| JP | 2014-182244 | A | 9/2014 |
| JP | 2016-506533 | A | 3/2016 |
| JP | 2016-085351 | A | 5/2016 |
| JP | 2017-022016 | A | 1/2017 |
| KR | 10-2013-0037126 | A | 4/2013 |
| WO | 2013/121655 | A1 | 8/2013 |
| WO | 2015/093149 | A1 | 6/2015 |
| WO | 2019/176918 | A1 | 9/2019 |
| WO | 2020/122116 | A1 | 6/2020 |

OTHER PUBLICATIONS

International Search Report issued in PCT/JP2021/039670 on Jan. 11, 2022.
Written Opinion issued in PCT/JP2021/039670 on Jan. 11, 2022.
International Preliminary Report on Patentability completed by WIPO on May 2, 2023 in connection with International Patent Application No. PCT/JP2021/039670.
Office Action, issued by the State Intellectual Property Office of China on Sep. 3, 2025, in connection with Chinese Patent Application No. 202180074127.6.

* cited by examiner

OPTICAL FILM, OPTICAL LAMINATE, AND IMAGE DISPLAY DEVICE

CROSS-REFERENCE TO RELATED APPLICATIONS

This application is a Continuation of PCT International Application No. PCT/JP2021/039670 filed on Oct. 27, 2021, which was published under PCT Article 21(2) in Japanese, and which claims priority under 35 U.S.C. § 119(a) to Japanese Patent Application No. 2020-180329 filed on Oct. 28, 2020 and Japanese Patent Application No. 2021-173733 filed on Oct. 25, 2021. The above applications are hereby expressly incorporated by reference, in their entirety, into the present application.

BACKGROUND OF THE INVENTION

1. Field of the Invention

The present invention relates to an optical film, an optical laminate, and an image display device.

2. Description of the Related Art

In recent years, as a display device that replaces a liquid crystal display device, a display device formed of a self-emission type light emitting element such as an organic electroluminescence (EL) or an inorganic electroluminescence (inorganic light emitting diode (LED)) has been developing.

An image display device reflects external light particularly in a bright environment and degrades the contrast.

Therefore, a self-emission type display device formed of a light emitting element, such as an organic EL display device or an inorganic EL display device, is provided with a circularly polarizing plate consisting of a polarizer and a λ/4 plate on a surface thereof, as an antireflection film.

For example, JP2009-259721A describes an organic EL display device including an organic EL element portion consisting of a reflective electrode, an organic EL light emitting layer, and a transparent electrode, and a circularly polarizing plate consisting of a retardation plate and a polarizing plate, in which an antireflection layer having a high reflectivity of light reflected on a surface of the circularly polarizing plate in a complementary wavelength range of the color is provided on an air interface of a member provided on a side of an observer with respect to the circularly polarizing plate.

Further, JP2017-022016A describes a circularly polarizing plate for an organic EL display device, including a polarizer, a retardation layer functioning as a λ/4 plate, a barrier layer, and a pressure sensitive adhesive layer having a barrier function in this order, in which the barrier layer is thin glass having a thickness of 5 to 100 and an organic EL display device including this circularly polarizing plate.

SUMMARY OF THE INVENTION

Such a self-emission type display device such as an inorganic EL display device or an organic EL display device includes an antireflection film (circularly polarizing plate) consisting of a polarizer and a λ/4 plate, and thus images can be displayed with high contrast by preventing reflection of external light.

However, on the other hand, the antireflection film consisting of a polarizer and a λ/4 plate also absorbs the light emitted by the light emitting element. Therefore, the self-emission type display device of the related art has low utilization efficiency of light so that the performance of the light emitting element such as an LED cannot be sufficiently exhibited.

The present invention has been made to solve such problems of the related art, and an object of the present invention is to provide an optical film that enables obtainment of an image display device capable of achieving both the antireflection effect of external light and improvement of the utilization efficiency of light emitted by a light emitting element in a case of being applied to a self-emission type image display device formed of an inorganic EL element, an organic EL element, or the like.

Further, an object of the present invention is also to provide an optical laminate and an image display device.

As a result of intensive examination conducted by the present inventors in order to solve the above-described problems, it was found that the above-described problems can be solved by the following configurations.

[1] An optical film comprising: a light absorption anisotropic film consisting of a cured substance of a liquid crystal composition that contains a polymerizable liquid crystal compound and a dichroic coloring agent compound, in which the light absorption anisotropic film has, in the same film surface, a region A where an inclination of an absorption axis with respect to a film surface is θA and a region B where an inclination of an absorption axis with respect to the film surface is θB, and θA and θB satisfy relationships of Expressions (1) and (2).

$$|\theta A-\theta B|\geq 10°\quad \text{Expression (1)}$$

$$0°\leq\theta B\leq 5°\quad \text{Expression (2)}$$

[2] The optical film according to [1], in which the inclination θA of the absorption axis is in a range of 45° to 90°.

[3] The optical film according to [1] or [2], in which the inclination θA of the absorption axis is in a range of 80° to 90°.

[4] The optical film according to any one of [1] to [3], in which a transmittance of the region A in an absorption axis direction is 65% or greater.

[5] The optical film according to any one of [1] to [4], in which an alignment degree of the region B in an in-plane direction is 0.950 or greater.

[6] The optical film according to any one of [1] to [5], in which a content of the dichroic coloring agent compound is 15% by mass or greater with respect to a total mass of the light absorption anisotropic film.

[7] An optical laminate which is formed by laminating the optical film according to any one of [1] to [6] and a λ/4 plate.

[8] An image display device comprising: the optical film according to any one of [1] to [6]; or the optical laminate according to [7].

[9] The image display device according to [8], in which a position of the region A of the light absorption anisotropic film corresponds to a position of a light emitting element of the image display device.

[10] The image display device according to [8] or [9], in which the image display device is an electroluminescence display device.

[11] The image display device according to any one of [8] to [10], in which a total thickness of the optical film and the λ/4 plate is 20 μm or less.

According to the present invention, it is possible to provide an optical film that enables obtainment of an image display device capable of achieving both the antireflection effect of external light and improvement of the utilization efficiency of light emitted by a light emitting element in a case of being applied to a self-emission type image display device formed of an inorganic EL element, an organic EL element, or the like.

Further, according to the present invention, it is possible to provide an optical laminate and an image display device.

DESCRIPTION OF THE PREFERRED EMBODIMENTS

Figure 1:
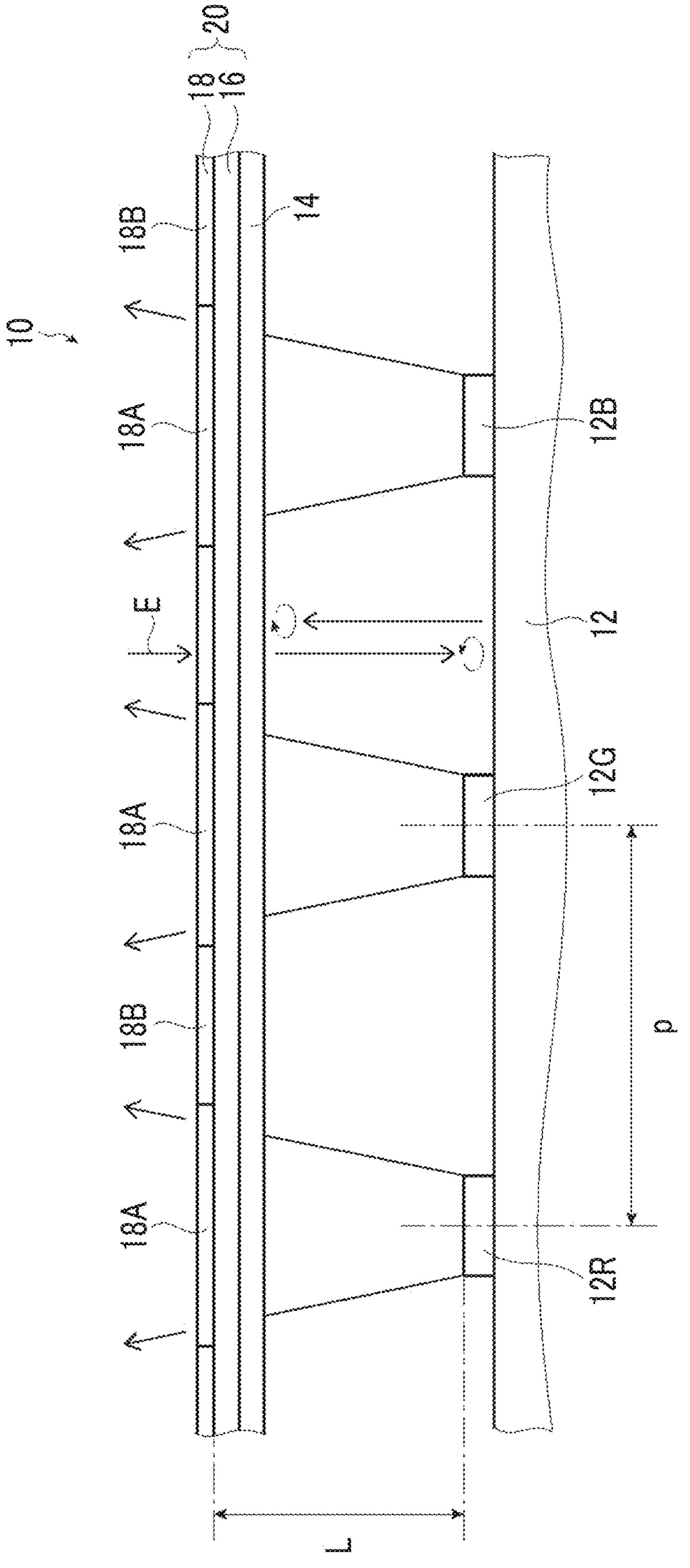
FIG. 1 is a view conceptually illustrating an example of an image display device of the present invention.

Hereinafter, an optical film, an optical laminate, and an image display device according to the embodiment of the present invention will be described in detail with reference to preferred examples shown in the accompanying drawings.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, the terms parallel, orthogonal, horizontal, and vertical do not indicate parallel, orthogonal, horizontal, and vertical in a strict sense, but indicate a range of parallel±10°, a range of orthogonal±10°, a range of horizontal±10°, and a range of vertical±10° respectively.

Further, in the present specification, the concepts of the liquid crystal composition and the liquid crystal compound also include those that no longer exhibit liquid crystallinity due to curing or the like.

Further, in the present specification, materials corresponding to respective components may be used alone or in combination of two or more kinds thereof. Here, in a case where two or more kinds of materials corresponding to respective components are used in combination, the content of the components indicates the total content of the combined materials unless otherwise specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

In the present invention, visible light is light having a wavelength that can be seen by human eyes among electromagnetic waves and indicates light in a wavelength range of 380 to 780 nm. Invisible light is light in a wavelength range of less than 380 nm and in a wavelength range of greater than 780 nm.

Further, although not limited thereto, among visible light, light in a wavelength range of 420 to 490 nm is blue light, light in a wavelength range of 495 to 570 nm is green light, and light in a wavelength range of 620 to 750 nm is red light.

<Optical Film>

An optical film according to the embodiment of the present invention is an optical film including a light absorption anisotropic film consisting of a cured substance of a liquid crystal composition that contains a polymerizable liquid crystal compound and a dichroic coloring agent compound, in which the light absorption anisotropic film has, in the same film surface, a region A where an inclination of an absorption axis with respect to a film surface is θA and a region B where an inclination of an absorption axis with respect to the film surface is θB, and θA and θB satisfy relationships of Expressions (1) and (2).

$$|\theta A-\theta B|\geq 10° \quad \text{Expression (1)}$$

$$0°\leq\theta B\leq 5° \quad \text{Expression (2)}$$

Here, the absorption axis is a direction in which the transmittance at a wavelength of 550 nm is the highest in a case where the transmittance is measured by changing an inclination angle and an inclination direction with respect to a film normal direction, and denotes, for example, an average value (average direction) of molecules of aligned dichroic coloring agent compounds in a major axis direction. The transmittance obtained by changing the inclination angle and the inclination direction can be measured, for example, by using AxoScan OPMF-1 (manufactured by Opto Science, Inc.).

Figure 2:
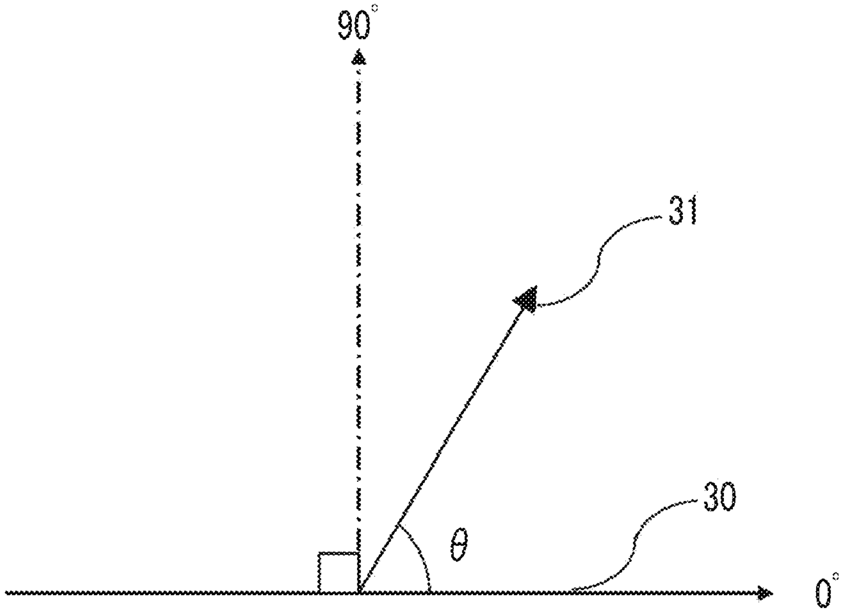
FIG. 2 is a schematic view illustrating the definition of θ, which is an angle formed by an absorption axis of a light absorption anisotropic film used in the present invention.

Here, as illustrated in FIG. 2, an angle between a direction parallel to a surface 30 of the optical film according to the embodiment of the present invention and an absorption axis 31 in a region where the light absorption anisotropic film used in the present invention is present is defined as θ. θA denotes an angle between the surface of the optical film according to the embodiment of the present invention and the absorption axis in the region A, and θB denotes an angle between the surface of the optical film according to the embodiment of the present invention and the absorption axis in the region B.

Figure 3:
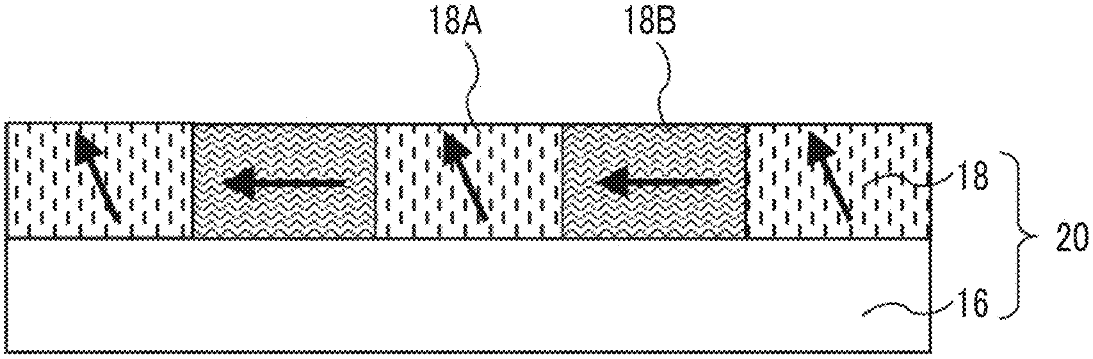
FIG. 3 is a cross-sectional view conceptually illustrating an example of an optical film of the present invention.

FIG. 3 is a cross-sectional view conceptually illustrating an example of the optical film according to the embodiment of the present invention.

An optical film 20 illustrated in FIG. 3 includes a transparent support 16 and a light absorption anisotropic film 18, and the light absorption anisotropic film 18 consists of a cured substance of a liquid crystal composition containing a polymerizable liquid crystal compound and a dichroic coloring agent compound. Further, the light absorption anisotropic film has, in the same film thickness, a region 18A where an inclination of an absorption axis with respect to the film surface is θA and a region 18B where an inclination of an absorption axis with respect to the film surface is θB, and θA and θB satisfy relationships of Expressions (1) and (2).

$$|\theta A-\theta B|\geq 10^{\circ}\qquad \text{Expression (1)}$$

$$0^{\circ}\leq \theta B\leq 5^{\circ}\qquad \text{Expression (2)}$$

The antireflection performance of external light and the transmission performance of the light emitting element can be adjusted for each region by allowing the light absorption anisotropic film to have two regions with different absorption axes in the same film surface, and thus a self-emission type display device which is formed of an inorganic EL element, an organic EL element, or the like and capable of achieving both the antireflection effect of external light and improvement of utilization efficiency of light emitted by the light emitting element can be provided.

Specifically, in the region B in which the absorption axis is close to parallel to the film surface, polarization performance with respect to external light in a vertical incident direction is excellent and a higher antireflection effect is exhibited than those of the region A. Further, in the region A in which the absorption axis is close to perpendicular to the film surface as compared with the absorption axis of the region B, it is assumed that the visible light transmittance in the vertical incident direction is high and the effect of improving the utilization of the luminous efficacy of the self-emission type element is exhibited.

In the present invention, from the viewpoint that the effects of the present invention are excellent, |θA−θB| is preferably 10° or greater, more preferably 45° or greater, and still more preferably 80° or greater. The upper limit thereof is not particularly limited, but is, for example, 90°.

In a case where |θA−θB| is set to a value in the above-described ranges, both the antireflection effect of external light in the light absorption anisotropic film and improvement of the utilization efficiency of light emitted by the light emitting element can be achieved.

In the present invention, from the viewpoint that the effects of the present invention are excellent, θA is preferably in a range of 45° to 90° and more preferably in a range of 80° to 90°. In a case where θA is set to a value in the above-described ranges, absorption of light emitted from the light emitting element in the light absorption anisotropic film is reduced, and the utilization efficiency of light is improved.

In the present invention, from the viewpoint that the effects of the present invention are excellent, the transmittance of the region A in the absorption axis direction is preferably 65% or greater and more preferably 75% or greater. In a case where the transmittance is set to a value in the above-described ranges, absorption of light emitted from the light emitting element in the light absorption anisotropic film is reduced, and the utilization efficiency of light is improved. The upper limit of the transmittance is not particularly limited, but is less than 100% in many cases.

In the present invention, the alignment degree of the region B in the in-plane direction is not particularly limited and is 0.930 or greater in many cases. From the viewpoint that the effects of the present invention are excellent, the alignment degree of the region B in the in-plane direction is preferably 0.950 or greater and more preferably 0.955 or greater. In a case where the alignment degree thereof is set to a value in the above-described ranges, the antireflection performance in a case of using the light absorption anisotropic film is improved. The upper limit of the alignment degree is not particularly limited and is, for example, 1.000.

The alignment degree thereof in the in-plane direction can be measured by the following method.

A sample is set in a state where a linear polarizer is inserted on a light source side of an optical microscope (product name, "ECLIPSE E600 POL", manufactured by Nikon Corporation), the absorbance of the light absorption anisotropic film in a wavelength range of 380 nm to 780 nm is measured at a pitch of 1 nm using a multi-channel spectrometer (product name, "QE65000", manufactured by Ocean Optics, Inc.), and the alignment degree in a wavelength range of 400 nm to 700 nm is calculated by the following equation.

$$S=((Az0/Ay0)-1)/((Az0/Ay0)+2)\qquad \text{Alignment degree:}$$

In the equation above, "Az0" represents the absorbance of the light absorption anisotropic film in the region B with respect to polarized light in the absorption axis direction, and "Ay0" represents the absorbance of the optically anisotropic layer in the region B with respect to polarized light in the transmission axis direction. The alignment degree at a wavelength of 560 nm in the above-described measurement is defined as the alignment degree of the region B in the in-plane direction.

[Light Absorption Anisotropic Film]

As described above, the light absorption anisotropic film used in the present invention consists of a cured substance of a liquid crystal composition containing a polymerizable liquid crystal compound and a dichroic coloring agent compound.

[Polymerizable Liquid Crystal Compound]

As the polymerizable liquid crystal compound contained in the liquid crystal composition, both a high-molecular-weight polymerizable liquid crystal compound and a low-molecular-weight polymerizable liquid crystal compound can be used, and a high-molecular-weight polymerizable liquid crystal compound is preferably used from the viewpoint of increasing the alignment degree.

Here, "high-molecular-weight polymerizable liquid crystal compound" denotes a polymerizable liquid crystal compound having a repeating unit in the chemical structure.

Here, "low-molecular-weight polymerizable liquid crystal compound" denotes a polymerizable liquid crystal compound having no repeating units in the chemical structure.

In addition, a high-molecular-weight polymerizable liquid crystal compound and a low-molecular-weight polymerizable liquid crystal compound may be used in combination as the polymerizable liquid crystal compound. As the low-molecular-weight polymerizable liquid crystal compound, for example, the description in paragraphs [0042] to [0053] of WO2019/235355A can be referred to.

From the viewpoint of further increasing the alignment degree of the light absorption anisotropic film to be obtained, it is preferable that the polymerizable liquid crystal compound is a high-molecular-weight polymerizable liquid crystal compound having a repeating unit represented by Formula (1) (hereinafter, also referred to as "repeating unit (1)").

In the following description, the expression "alignment degree of the light absorption anisotropic film to be obtained further increases" is also referred to as "effects of the present invention are more excellent".

(1)

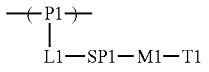

In Formula (1), P1 represents the main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

(P1-A)

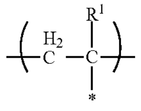

(P1-B)

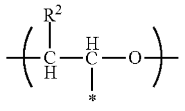

(P1-C)

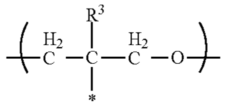

(P1-D)

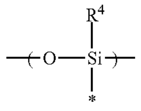

In Formulae (P1-A) to (P1-D), "*" represents a bonding position with respect to L1 in Formula (1).

In Formulae (P1-A) to (P1-D), $R^1$, $R^2$, $R^3$, and $R^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula, $R^{14}$ has the same definition as that for $R^4$ in (P1-D), and a plurality of $R^{15}$'s each independently represent a hydrogen atom or an alkyl group having 1 to 10 carbon atoms.

In Formula (1), L1 represents a single bond or a divalent linking group.

Examples of the divalent linking group represented by L1 include —C(O)O—, —OC(O)—, —O—, —S—, —C(O)$NR^3$—, —$NR^3$C(O)—, —$SO_2$—, and —$NR^3R^4$—. In the formulae, $R^3$ and $R^4$ each independently represent a hydrogen atom or an alkyl group having 1 to 6 carbon atoms which may have a substituent.

In a case where P1 represents a group represented by Formula (P1-A), from the viewpoint that the effects of the present invention are more excellent, it is preferable that L1 represents a group represented by —C(O)O—.

In a case where P1 represents a group represented by any of Formulae (P1-B) to (P1-D), from the viewpoint that the effects of the present invention are more excellent, it is preferable that L1 represents a single bond.

In Formula (1), from the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by $*-(CH_2-CH_2O)_{n1}-*$ is preferable. In the formula, n1 represents an integer of 1 to 20, and "*" represents a bonding position with respect to L1 or M1 in Formula (1). From the viewpoint that the effects of the present invention are more excellent, n1 represents preferably an integer of 2 to 10, more preferably an integer of 2 to 4, and still more preferably 3.

Further, from the viewpoint that the effects of the present invention are more excellent, a group represented by $*-(CH(CH_3)-CH_2O)_{n2}-*$ is preferable as the oxypropylene structure represented by SP1. In the formula, n2 represents an integer of 1 to 3, and "*" represents a bonding position with respect to L1 or M1.

Further, from the viewpoint that the effects of the present invention are more excellent, a group represented by $*-(Si(CH_3)_2-O)_{n3}-*$ is preferable as the polysiloxane structure represented by SP1. In the formula, n3 represents an integer of 6 to 10, and "*" represents a bonding position with respect to L1 or M1.

Further, from the viewpoint that the effects of the present invention are more excellent, a group represented by $*-(CF_2-CF_2)_{n4}-*$ is preferable as the alkylene fluoride structure represented by SP1. In the formula, n4 represents an integer of 6 to 10, and "*" represents a bonding position with respect to L1 or M1.

In Formula (1), the mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and for example, particularly description on pages 7 to 16 of "Flussige Kristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee can be referred to.

As the mesogen group, for example, a group having at least one cyclic structure selected from the group consisting of an aromatic hydrocarbon group, a heterocyclic group, and an alicyclic group is preferable.

From the viewpoint that the effects of the present invention are more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention are more excellent, as the mesogen group, a group represented by Formula (M1-A) or Formula (M1-B) is preferable, and a group represented by Formula (M1-B) is more preferable.

$$*\!-\!\left(A1\right)_{a1}\!-\!* \qquad \text{(M1-A)}$$

$$*\!-\!\left(A2-LA1\right)_{a2}\!-\!A3-* \qquad \text{(M1-B)}$$

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. Among these, from the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention are more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention are more excellent, it is preferable that one of the two LA1's represents a divalent linking group and the other represents a single bond.

In Formula (M1-B), examples of the divalent linking group represented by LA1 include —O—, $—(CH_2)_g—$, $—(CF_2)_g—$, $—Si(CH_3)_2—$, $—(Si(CH_3)_2O)_g—$, $—(OSi(CH_3)_2)_g—$ (g represents an integer of 1 to 10), —N(Z)—, —C(Z)=C(Z')—, —C(Z)=N—, —N=C(Z)—, $—C(Z)_2—C(Z')_2—$, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, a C1 to C4 alkyl group (alkyl group having 1 to 4 carbon atoms), a cycloalkyl group, an aryl group, a cyano group, or a halogen atom), —N=N—, —S—, —S(O)—, —S(O)(O)—, —(O)S(O)O—, —O(O)S(O)O—, —SC(O)—, and —C(O)S—. Among these, from the viewpoint that the effects of the present invention are more excellent, —C(O)O— is preferable. LA1 may represent a group obtained by combining two or more of these groups.

Specific examples of M1 include the following structures. In the following specific examples, "Ac" represents an acetyl group.

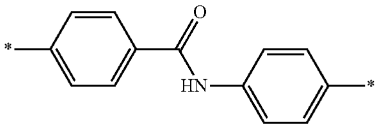
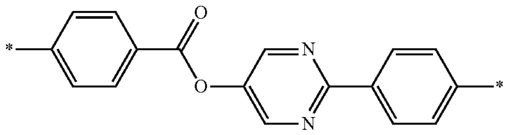
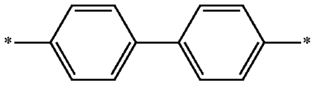
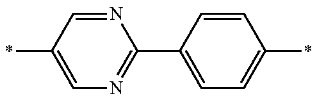
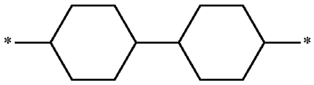
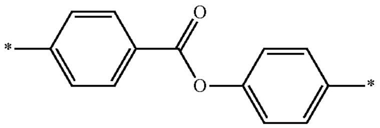
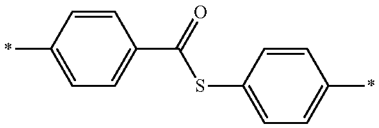
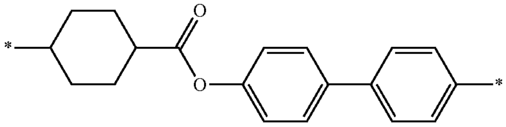
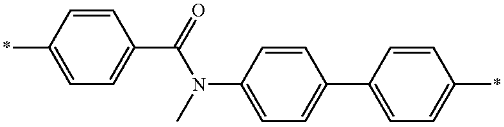
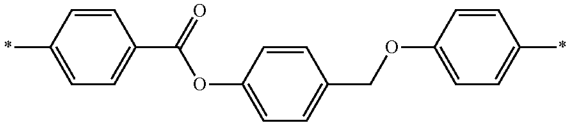
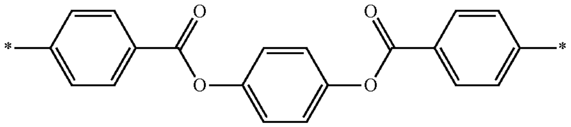
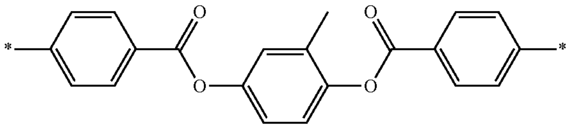
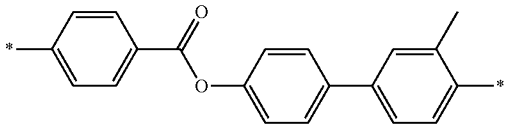
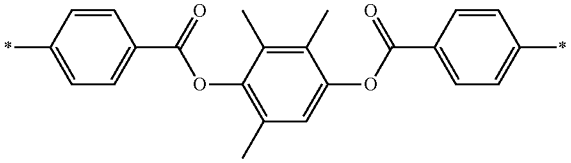
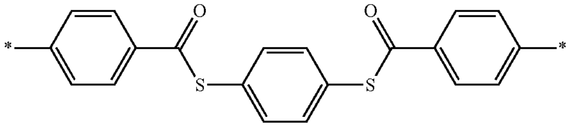
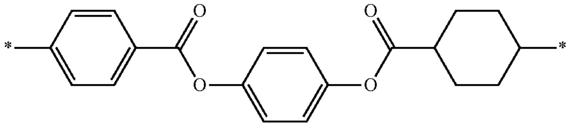
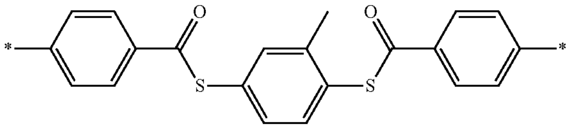
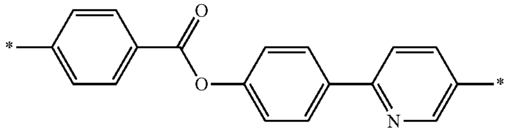
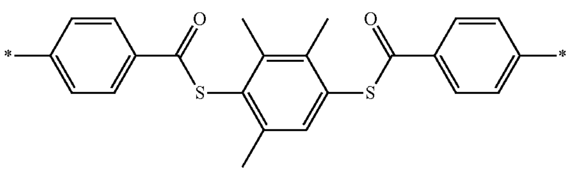
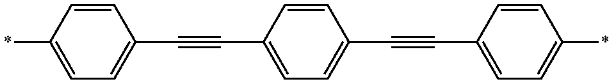

-continued
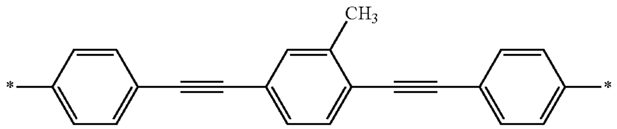
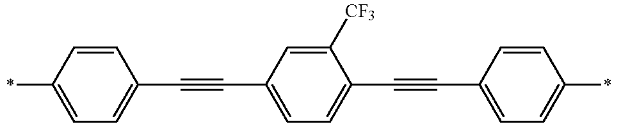
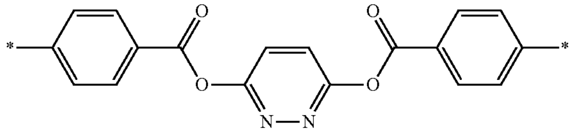
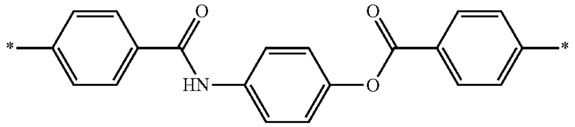
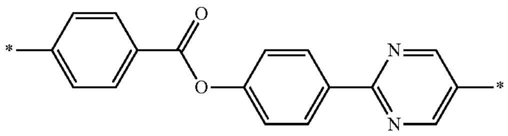
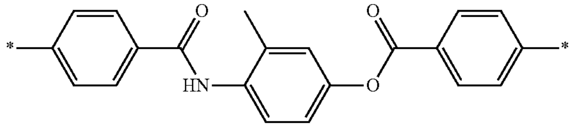
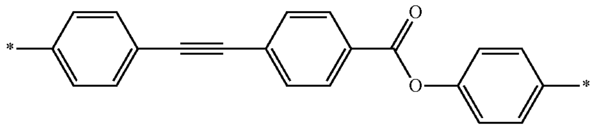
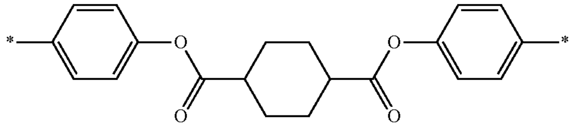
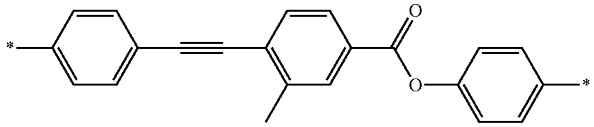
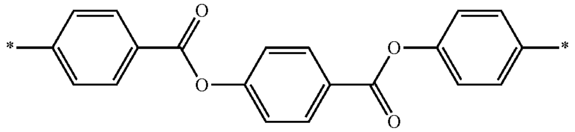
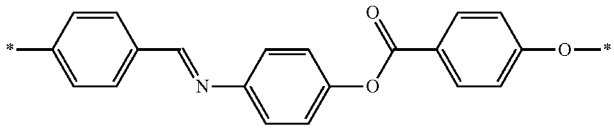
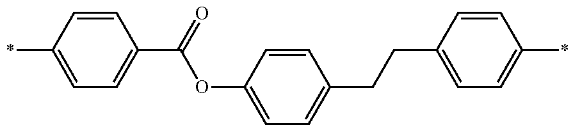
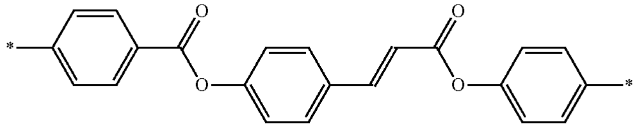
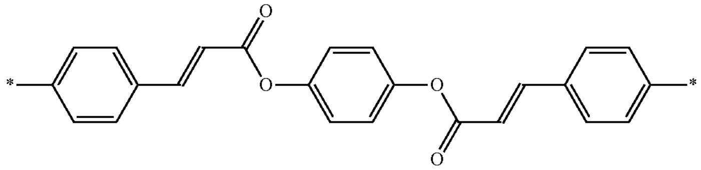

-continued
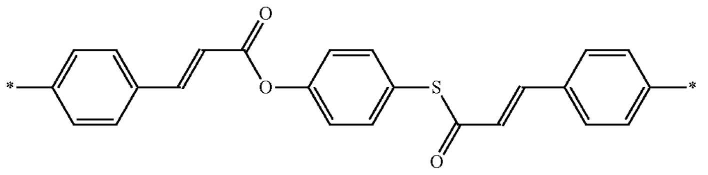
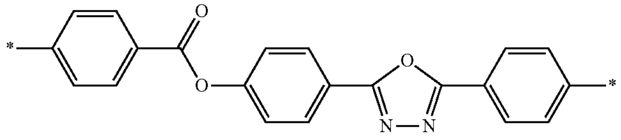
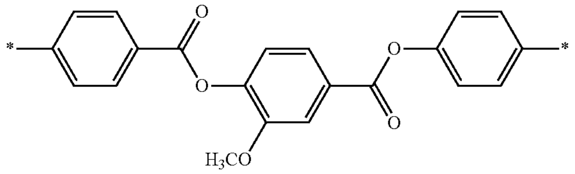
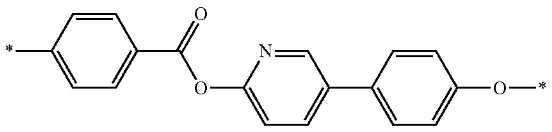
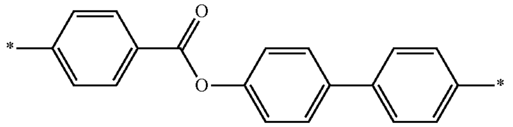
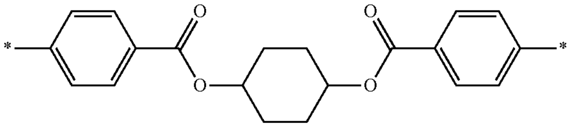
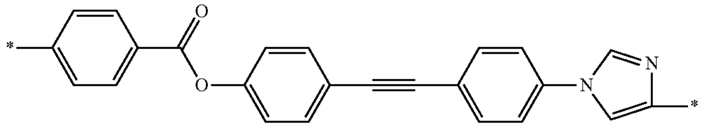
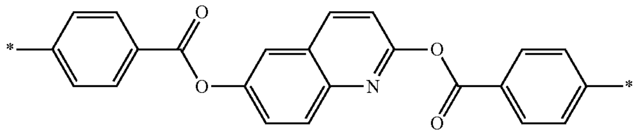
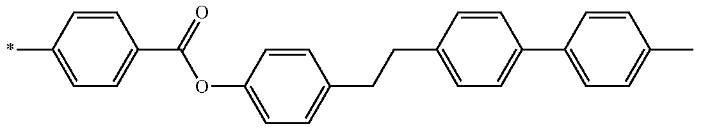
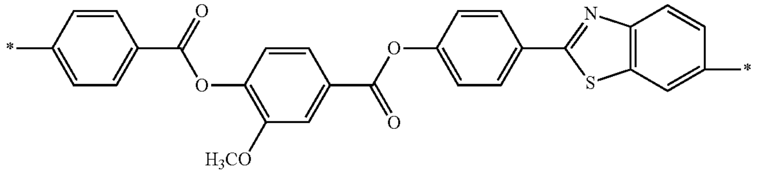
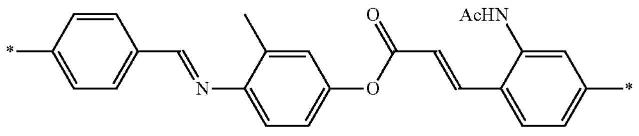
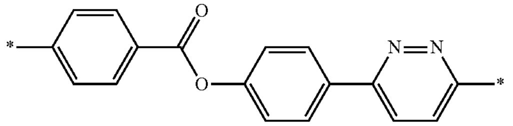
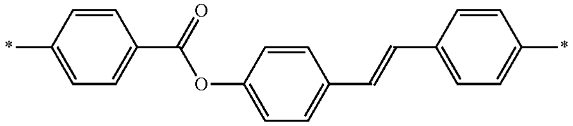
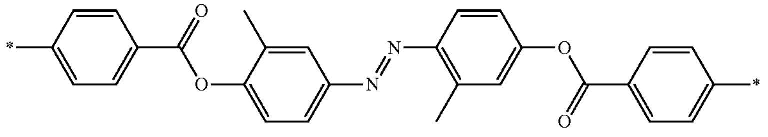
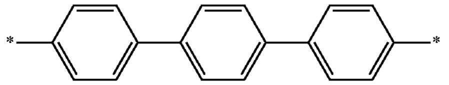

-continued
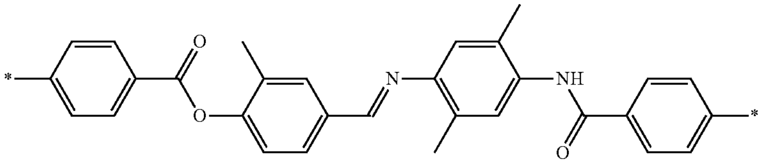
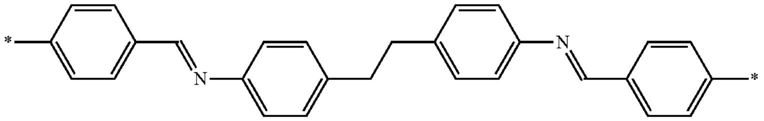
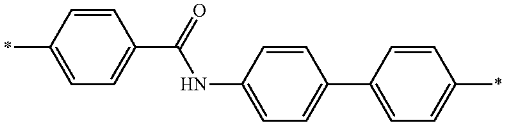
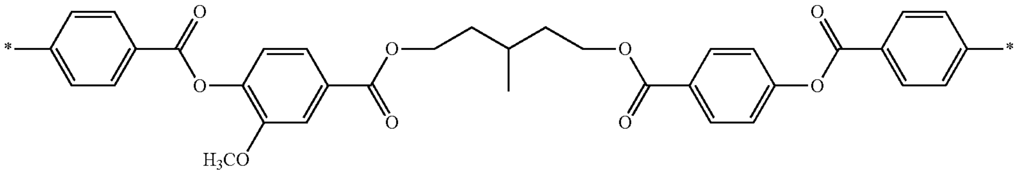
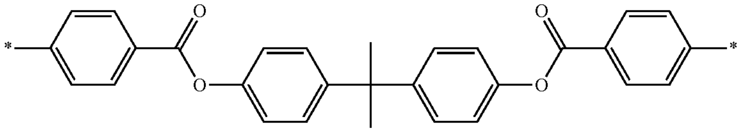
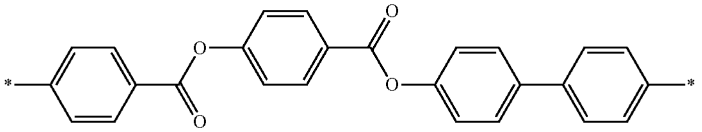
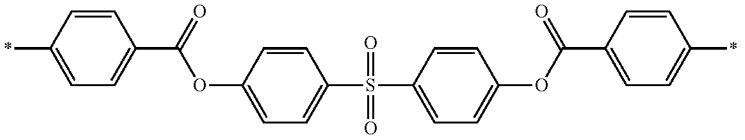
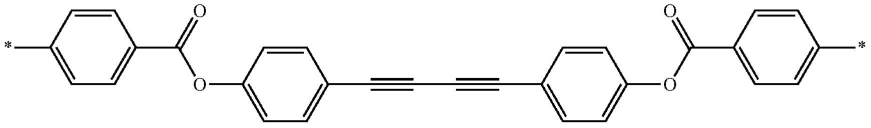
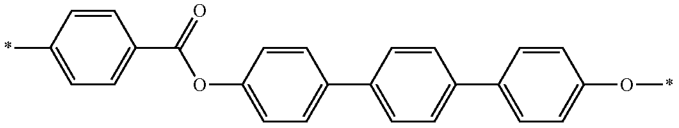
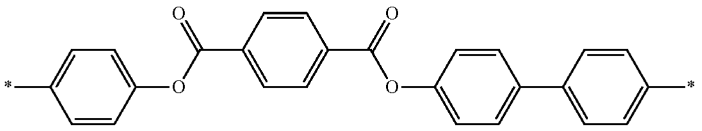
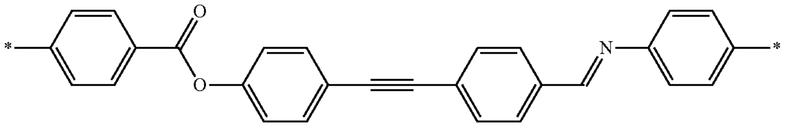
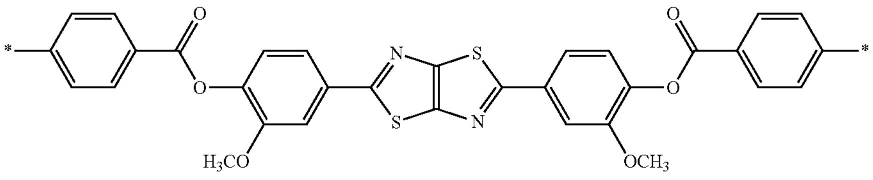

-continued

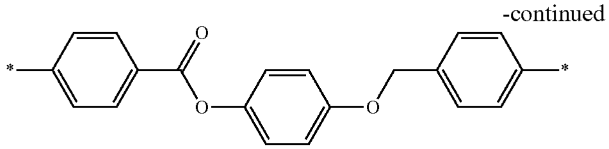

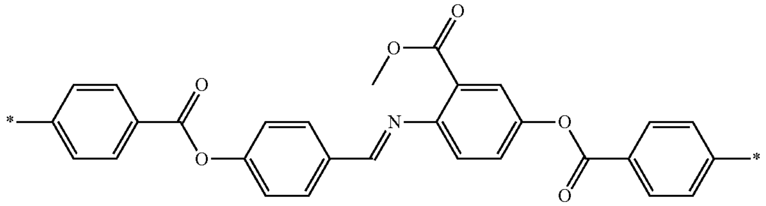

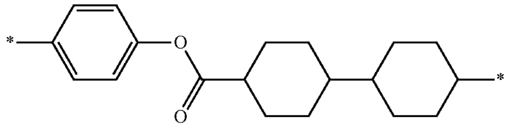

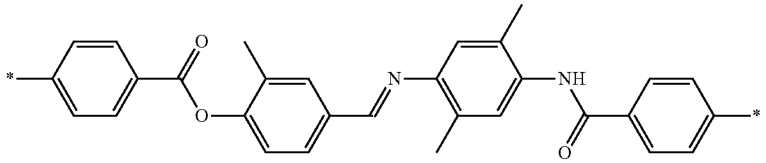

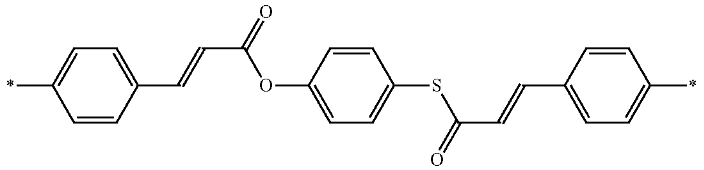

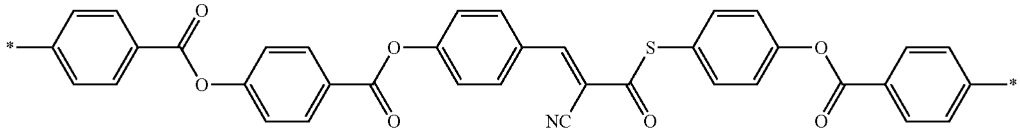

From the viewpoint of further enhancing the adhesiveness of the film to the adjacent layer and improving the cohesive force of the film, it is preferable that T1 represents a polymerizable group.

Here, the polymerizable group is not particularly limited, but a polymerizable group capable of radical polymerization or cationic polymerization is preferable.

As the radically polymerizable group, a generally known radically polymerizable group can be used, and suitable examples thereof include an acryloyl group and a methacryloyl group. In this case, since the acryloyl group is generally known to have a higher polymerization rate, the acryloyl group is preferable from the viewpoint of improving productivity, but the methacryloyl group can also be used as the polymerizable group.

As the cationically polymerizable group, a generally known cationically polymerizable group can be used, and specific examples thereof include an alicyclic ether group, a cyclic acetal group, a cyclic lactone group, a cyclic thioether group, a spiroorthoester group, and a vinyloxy group. Among these, an alicyclic ether group or a vinyloxy group is preferable, and an epoxy group, an oxetanyl group, or a vinyloxy group is more preferable.

From the viewpoint that the effects of the present invention are more excellent, the weight-average molecular weight (Mw) of the high-molecular-weight polymerizable liquid crystal compound having a repeating unit represented by Formula (1) is preferably in a range of 1,000 to 500,000 and more preferably in a range of 2,000 to 300,000. In a case where the Mw of the high-molecular-weight polymerizable liquid crystal compound is in the above-described ranges, the high-molecular-weight polymerizable liquid crystal compound is easily handled.

In particular, from the viewpoint of suppressing cracking during the coating, the weight-average molecular weight (Mw) of the high-molecular-weight polymerizable liquid crystal compound is preferably 10,000 or greater and more preferably in a range of 10,000 to 300,000.

In addition, from the viewpoint of the temperature latitude of the alignment degree, the weight-average molecular weight (Mw) of the high-molecular-weight polymerizable liquid crystal compound is preferably less than 10,000 and more preferably 2,000 or greater and less than 10,000.

Here, the weight-average molecular weight and the number average molecular weight in the present invention are values measured according to gel permeation chromatography (GPC).

Solvent (eluent): N-methylpyrrolidone

Equipment name: TOSOH HLC-8220GPC

Column: Connect and use three of TOSOH TSKgel Super AWM-H (6 mm×15 cm)

Column temperature: 25° C.

Sample concentration: 0.1% by mass

Flow rate: 0.35 mL/min

Calibration curve: TSK standard polystyrene (manufactured by TOSOH Corporation), calibration curves of 7 samples with Mw of 2,800,000 to 1,050 (Mw/Mn=1.03 to 1.06) are used.

In the present invention, the content of the polymerizable liquid crystal compound is preferably in a range of 8% to 99% by mass and more preferably in a range of 8% to 96% by mass with respect to the solid content in the liquid crystal composition.

Here, "solid content in the liquid crystal composition" denotes components obtained by removing solvents, and specific examples of the solid content include the polymerizable liquid crystal compound, and a dichroic coloring agent compound, a polymerization initiator, and a surfactant described below.

[Dichroic Coloring Agent Compound]

The dichroic coloring agent compound contained in the liquid crystal composition is not particularly limited, and examples thereof include a visible light absorbing substance (dichroic coloring agent), a light emitting substance (such as a fluorescent substance or a phosphorescent substance), an ultraviolet absorbing substance, an infrared absorbing substance, a non-linear optical substance, a carbon nanotube, and an inorganic substance (for example, a quantum rod). Further, known dichroic coloring agent compounds (dichroic coloring agents) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more kinds of dichroic coloring agent compounds may be used in combination. For example, from the viewpoint of making the color of the light absorption anisotropic film to be obtained closer to black, it is preferable that at least one dichroic coloring agent compound having a maximal absorption wavelength in a wavelength range of 370 nm or greater and less than 500 nm and at least one dichroic coloring agent compound having a maximal absorption wavelength in a wavelength range of 500 nm or greater and less than 700 nm are used in combination.

The dichroic coloring agent compound may contain a crosslinkable group.

Specific examples of the crosslinkable group include a (meth)acryloyl group, an epoxy group, an oxetanyl group, and a styryl group. Among these, a (meth)acryloyl group is preferable.

From the viewpoint that the effects of the present invention are excellent, the content of the dichroic coloring agent compound is preferably in a range of 1 to 400 parts by mass, more preferably in a range of 2 to 100 parts by mass, and still more preferably in a range of 5 to 30 parts by mass with respect to 100 parts by mass of the polymerizable liquid crystal compound.

Further, from the viewpoint of reducing the thickness of the light absorption anisotropic film and increasing the alignment degree, the content of the dichroic coloring agent compound is preferably 10% by mass or greater and more preferably 15% by mass or greater with respect to the solid content in the liquid crystal composition. Further, from the viewpoint of having a cohesive force as a layer and maintaining the flexibility, the content thereof is preferably 40% by mass or less and more preferably 30% by mass or less with respect to the solid content in the liquid crystal composition.

Further, the content of the dichroic coloring agent compound in the light absorption anisotropic film is preferably 15% by mass or greater with respect to the total mass of the light absorption anisotropic film. The upper limit thereof is not particularly limited, but is preferably 40% by mass or less.

From the viewpoint that the effects of the present invention are excellent, it is preferable that the dichroic coloring agent compound is aligned in a certain direction in the light absorption anisotropic film. A method of aligning the dichroic coloring agent compound is not particularly limited, and a technique for desirably aligning the dichroic coloring agent compound can refer to a technique for preparing a polarizer formed of a dichroic coloring agent compound, a technique for preparing a guest-host liquid crystal cell, and the like. For example, techniques used in the method of preparing a dichroic polarizer described in JP1999-305036A (JP-H11-305036A) or JP2002-090526A and the method of preparing a guest-host type liquid crystal display device described in JP2002-99388A or JP2016-27387A can be used for preparation of the light absorption anisotropic film used in the present invention.

The liquid crystal composition may also contain components such as a polymerization initiator, a surfactant, and an adhesion improver.

[Polymerization Initiator]

The polymerization initiator to be used is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-027384A), and acylphosphine oxide compounds (JP1988-040799B (JP-S63-040799B), JP1993-29234B (JP-H5-29234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the liquid crystal composition contains a polymerization initiator, the content of the polymerization initiator is preferably in a range of 0.01 to 30 parts by mass and more preferably in a range of 0.1 to 15 parts by mass with respect to 100 parts by mass of the total amount of the dichroic coloring agent compound and the liquid crystal compound in the liquid crystal composition. The durability of the light absorption anisotropic film is enhanced in a case where the content of the polymerization initiator is 0.01 parts by mass or greater, and the alignment degree of the light absorption anisotropic film is enhanced in a case where the content thereof is 30 parts by mass or less.

The polymerization initiator may be used alone or in combination of two or more kinds thereof. In a case where the composition contains two or more kinds of polymerization initiators, it is preferable that the total amount of the polymerization initiators is in the above-described ranges.

[Surfactant]

It is preferable that the liquid crystal composition contains a surfactant.

In a case where the liquid crystal composition contains a surfactant, the smoothness of the coated surface is improved, the alignment degree is further improved, and cissing and unevenness are suppressed so that the in-plane uniformity is expected to be improved.

A surfactant that allows the dichroic coloring agent compound and the liquid crystal compound to be aligned horizontally or vertically on the coated surface side may be used as the surfactant. For example, the compound described in paragraphs [0155] to [0170] of WO2016/009648A, the compound (horizontal alignment agent) described in paragraphs [0253] to [0293] of JP2011-237513A, and the compound (vertical alignment agent) described in paragraphs [0071] to [0097] of WO2019/235355A can be used. Further, a polyacrylate-based surfactant or a fluorine atom-containing surfactant is also preferable as the surfactant.

The surfactant contained in the liquid crystal composition may be a fluorine-containing polymer having a repeating structure B1 represented by Formula (B-1) and a repeating structure B2 having a fluorine atom.

(Repeating Structure B1)

The repeating structure B1 of the fluorine-containing polymer is a repeating structure represented by Formula (B-1).

(B-1)

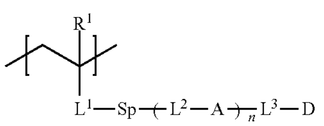

In Formula (B-1), $R^1$ represents a hydrogen atom, an alkyl group having 1 to 5 carbon atoms, or a halogen atom.

Further, $L^1$ represents a single bond or —CO—.

In addition, Sp represents a linear or branched divalent hydrocarbon group having 1 to 20 carbon atoms. Here, one or two or more —$CH_2$-'s that are not adjacent to each other among —$CH_2$-'s constituting a part of a hydrocarbon group may be each independently substituted with —O—, —S—, —NH—, or —N(Q)-, and Q represents a substituent.

$L^2$ and $L^3$ each independently represent a single bond or a divalent linking group.

$R^1$ in Formula (B-1) represents preferably a hydrogen atom or an alkyl group having 1 to 5 carbon atoms and more preferably a hydrogen atom or a methyl group.

It is preferable that $L^1$ in Formula (B-1) represents —CO—.

Examples of the linear or branched divalent hydrocarbon group having 1 to 20 carbon atoms represented by Sp in Formula (B-1) include a linear or branched divalent aliphatic hydrocarbon group having 1 to 20 carbon atoms, a divalent alicyclic hydrocarbon group having 3 to 20 carbon atoms, a divalent aromatic hydrocarbon group having 6 to 20 carbon atoms, and a divalent aromatic heterocyclic group having 6 to 20 carbon atoms. Among these, a linear or branched divalent aliphatic hydrocarbon group having 1 to 20 carbon atoms is preferable.

Here, as the divalent aliphatic hydrocarbon group having 1 to 20 carbon atoms, an alkylene group having 1 to 15 carbon atoms is preferable, and an alkylene group having 1 to 8 carbon atoms is more preferable, and specific suitable examples thereof include a methylene group, an ethylene group, a propylene group, a butylene group, a pentylene group, a hexylene group, a methylhexylene group, and a heptylene group.

As described above, one or two or more —$CH_2$-'s that are not adjacent to each other among —$CH_2$-'s constituting a part of a linear or branched divalent hydrocarbon group having 1 to 20 carbon atoms as Sp may be each independently substituted with —O—, —S—, —NH—, or —N(Q)-. Further, examples of the substituent represented by Q include the above-described substituent W. Among these, an alkyl group, an alkoxy group, or a halogen atom is preferable.

Examples of the divalent linking group represented by one aspect of L2 and L3 in Formula (B-1) include —C(O)O—, —OC(O)—, —O—, —S—, —C(O)$NR^{L1}$—, —$NR^{L1}$C(O)—, —$SO_2$—, and —$NR^{L1}R^{L2}$—. In the formulae, $R^{L1}$ and $R^{L2}$ each independently represent a hydrogen atom or an alkyl group having 1 to 6 carbon atoms which may have a substituent. Further, examples of the substituent that the alkyl group having 1 to 6 carbon atoms may have include the above-described substituent W. Among these, an alkyl group, an alkoxy group, or a halogen atom is preferable.

In Formula (B-1), A represents a divalent linking group represented by any of Formulae (A-1) to (A-15). Here, "*" in Formulae (A-1) to (A-15) represents a bonding position with respect to L2 or L3, and the carbon atoms constituting the ring structures in Formulae (A-1) to (A-15) may be substituted with heteroatoms or may have substituents. In addition, examples of the substituents that the carbon atoms constituting the ring structures may have include the above-described substituent W. Among these, an alkyl group, an alkoxy group, or a halogen atom is preferable.

(A-1)

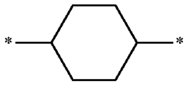

(A-2)

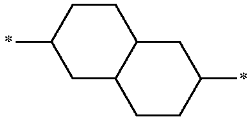

(A-3)

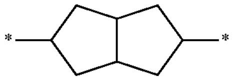

-continued (A-4)

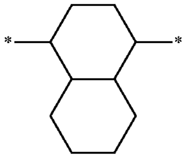

(A-5)

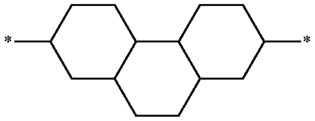

(A-6)

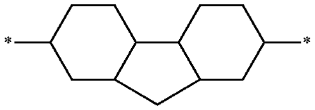

(A-7)

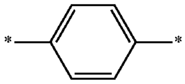

(A-8)

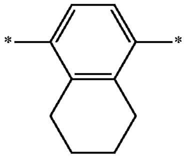

(A-9)

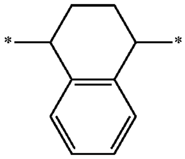

(A-10)

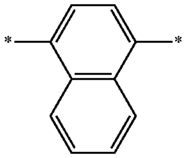

(A-11)

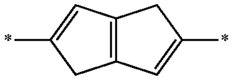

(A-12)

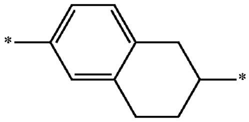

(A-13)

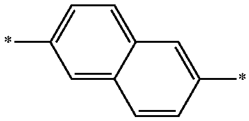

(A-14)

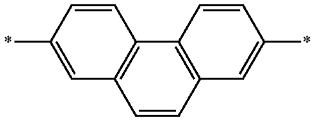

-continued (A-15)

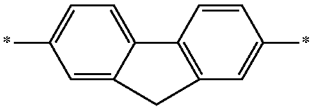

Specific examples of the divalent linking group represented by any of Formulae (A-1) to (A-15) include a 1,4-phenylene group, a 1,4-cyclohexylene group, a 1,4-cyclohexenyl group, a tetrahydropyran-2,5-diyl group, a 1,4-piperazine group, a 1,4-piperidine group, a 1,3-dioxane-2,5-diyl group, a tetrahydrothiopyran-2,5-diyl group, a 1,4-bicyclo(2,2,2)octylene group, a decahydronaphthalene-2,6-diyl group, a pyridine-2,5-diyl group, a pyrimidine-2,5-diyl group, a pyrazine-2,5-diyl group, a 1,2,3,4-tetrahydronaphthalene-2,6-diyl group, a 2,6-naphthylene group, a phenanthrene-2,7-diyl group, a 9,10-dihydrophenanthrene-2,7-diyl group, a 1,2,3,4,4a,9,10a-octahydrophenanthrene-2,7-diyl group, a 9-fluorenone-2,7-diyl group, a fluorene-2,7-diyl group, a thienothiophene-3,6-diyl group, a carbazole-3,6-diyl group, and a carbazole-2,7-diyl group.

In Formula (B-1), from the viewpoint of further increasing the alignment degree of the light absorption anisotropic film to be formed, A represents preferably a divalent linking group represented by any of Formulae (A-1), (A-4), (A-7), (A-10), and (A-13) and more preferably a divalent linking group represented by any of Formulae (A-7) and (A-13).

In Formula (B-1), D represents a hydrogen-bonding group formed of a hydrogen atom and a non-metal atom of Groups 14 to 16. Further, the non-metal atom may have a substituent.

Here, examples of the non-metal atoms of Groups 14 to 16 include an oxygen atom, a sulfur atom, a nitrogen atom, and a carbon atom.

Further, examples of the substituent that the non-metal atom (particularly, the nitrogen atom and the carbon atom) may have include a halogen atom, an alkyl group, an alkoxy group, an alkyl-substituted alkoxy group, a cyclic alkyl group, an aryl group (such as a phenyl group or a naphthyl group), a cyano group, an amino group, a nitro group, an alkylcarbonyl group, a sulfo group, and a hydroxyl group.

Examples of such a hydrogen-bonding group include a hydrogen bond-donating group and a hydrogen bond-accepting group.

Specific examples of the hydrogen bond-donating group include an amino group, an amide group, a urea group, a urethane group, a sulfonylamino group, a sulfo group, a phospho group, a hydroxy group, a mercapto group, a carboxyl group, a methylene group substituted with an electron withdrawing group, and a methine group substituted with electron withdrawing group. Among these, a carboxyl group or an amide group is preferable.

Specific examples of the hydrogen bond-accepting group include a heteroatom having an unshared electron pair on a heterocycle, a hydroxy group, an aldehyde group, a ketone group, a carboxyl group, a carboxylic acid ester group, a carboxylic acid amide group, a lactone group, a lactam group, a sulfonic acid amide group, a sulfo group, a phospho group, a phosphoric acid amide group, a urethane group, a urea group, an ether structure (particularly, a polymer structure having an oxygen atom in a polyether structure), an aliphatic amine group, and an aromatic amine group. Among these, a carboxyl group or an amide group is preferable.

(Repeating Structure B2)

The repeating structure B2 of the fluorine-containing polymer is a repeating structure having a fluorine atom.

In the present invention, from the viewpoint of further increasing the alignment degree of the light absorption anisotropic film to be formed, the content of the repeating structure B2 is preferably in a range of 15% to 90% by mass, more preferably in a range of 20% to 80% by mass, and still more preferably in a range of 30% to 70% by mass with respect to the total mass of the surfactant.

Further, the surfactant may have only one or two or more kinds of repeating structures B2. In a case where the surfactant has two or more kinds of repeating structures B2, the content of the repeating structures B2 is the total content of the repeating structure B2.

(Repeating Structure B3)

In the present invention, from the viewpoint of enhancing the upper layer coating properties with respect to the light absorption anisotropic film to be formed, it is preferable that the fluorine-containing polymer has a repeating structure B3 to be derived from a monomer having a molecular weight of 300 or less in addition to the repeating structures B1 and B2 described above.

From the viewpoint of enhancing the upper layer coating properties with respect to the light absorption anisotropic film to be formed, a repeating structure represented by Formula (N-1) is preferable as the repeating structure B3. It is preferable that the repeating structure B3 has a structure different from the repeating structure B2 described above and does not have a fluorine atom.

(N-1)

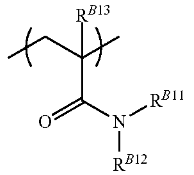

In Formula (N-1), $R^{B11}$ and $R^{B12}$ each independently represent a hydrogen atom or a substituent. Here, in a case where $R^{B11}$ and $R^{B12}$ represent a substituent, $R^{B11}$ and $R^{B12}$ may be linked to each other to form a ring.

The total molecular weight of $R^{B11}$ and $R^{B12}$ is preferably 200 or less, more preferably 100 or less, and still more preferably 70 or less. In a case where the total molecular weight thereof is 100 or less, the interaction between the repeating structures B3 is further improved, and the compatibility between the surfactant and the liquid crystal molecule can be further decreased. In this manner, a light absorption anisotropic film having less alignment defects and an excellent alignment degree can be obtained.

The lower limit of the total molecular weight of $R^{B11}$ and $R^{B12}$ is preferably 2 or greater.

From the viewpoint that the effects of the present invention are more excellent, as the substituent represented by $R^{B11}$ and $R^{B12}$, an organic group is preferable, an organic group having 1 to 15 carbon atoms is more preferable, an organic group having 1 to 12 carbon atoms is still more preferable, and an organic group having 1 to 8 carbon atoms is particularly preferable.

Examples of the organic group include a linear, branched, or cyclic alkyl group, an aromatic hydrocarbon group, and a heterocyclic group.

The number of carbon atoms of the alkyl group is preferably in a range of 1 to 15, more preferably in a range of 1 to 12, and still more preferably in a range of 1 to 8.

The carbon atoms of the alkyl group may be substituted with —O—, —$Si(CH_3)_2$—, —$(Si(CH_3)_2O)_g$—, —$(OSi(CH_3)_2)_g$— (g represents an integer of 1 to 10), —N(Z)—, —C(Z)═C(Z')—, —C(Z)═N—, —N═C(Z)—, —C(O)—, —OC(O)—, —C(O)O—, —O—C(O)O—, —N(Z)C(O)—, —C(O)N(Z)—, —C(Z)═C(Z')—C(O)O—, —O—C(O)—C(Z)═C(Z')—, —C(Z)═N—, —N═C(Z)—, —C(Z)═C(Z')—C(O)N(Z")—, —N(Z")—C(O)—C(Z)═C(Z')—, —C(Z)═C(Z')—C(O)—S—, —S—C(O)—C(Z)═C(Z')—, —C(Z)═N—N═C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N═N—, —S—, —C(S)—, —S(O)—, —$SO_2$—, —(O)S(O)O—, —O(O)S(O)O—, —SC(O)—, —C(O)S—, or a group obtained by combining two or more of these groups. Among the groups which may be substituted with the carbon atoms of the alkyl group, from the viewpoint that the effects of the present invention are more excellent, —O—, —C(O)—, —N(Z)—, —OC(O)—, or —C(O)O— is preferable.

Further, the hydrogen atoms of the alkyl group may be substituted with a halogen atom, a cyano group, an aryl group, a nitro group, —OZH, —C(O)ZH, —C(O)OZH, —OC(O)ZH, —OC(O)OZH, —NZHZH', —NZHC(O)ZH', —NZHC(O)OZH', —C(O)NZHZH', —OC(O)NZHZH', —NZHC(O)NZH'OZH", —SZH, —C(S)ZH, —C(O)SZH, or —SC(O)ZH. ZH, ZH', and ZH" each independently represent a hydrogen atom, a halogen atom, an alkyl group having 1 to 10 carbon atoms, a cyano group, or a nitro group. Among the groups which may be substituted with the hydrogen atoms of the alkyl group, from the viewpoint that the effects of the present invention are more excellent, —OH, —COOH, or an aryl group (preferably a phenyl group) is preferable.

Further, the hydrogen atoms of the aromatic hydrocarbon group and the hydrogen atoms of the heterocyclic group may be substituted with a halogen atom, a cyano group, an alkyl group having 1 to 10 carbon atoms, a nitro group, —OZH, —C(O)ZH, —C(O)OZH, —OC(O)ZH, —OC(O)OZH, —NZHZH', —NZHC(O)ZH', —NZHC(O)OZH', —C(O)NZHZH', —OC(O)NZHZH', —NZHC(O)NZH'OZH", —SZH, —C(S)ZH, —C(O)SZH, —SC(O)ZH, or —$B(OH)_2$. ZH, ZH', and ZH" each independently represent a hydrogen atom, a halogen atom, an alkyl group having 1 to 10 carbon atoms, a cyano group, or a nitro group. Among the groups which may be substituted with the hydrogen atoms of the aromatic hydrocarbon group and the hydrogen atoms of the heterocyclic group, from the viewpoint that the effects of the present invention are more excellent, —OH and —$B(OH)_2$ are preferable.

From the viewpoint that the effects of the present invention are more excellent, it is preferable that $R^{B11}$ and $R^{B12}$ each independently represent a hydrogen atom or an organic group having 1 to 15 carbon atoms. Preferred embodiments of the organic group are as described above.

From the viewpoint that the effects of the present invention are more excellent, at least one of $R^{B11}$ or $R^{B12}$ represents preferably a substituent and more preferably an organic group having 1 to 15 carbon atoms.

The ring formed by $R^{B11}$ and $R^{B12}$ being linked to each other is a heterocyclic ring having a nitrogen atom in Formula (N-1), and may further have heteroatoms such as an oxygen atom, a sulfur atom, and a nitrogen atom in the ring.

From the viewpoint that the effects of the present invention are more excellent, the ring formed by $R^{B11}$ and $R^{B12}$ being linked to each other is preferably a 4- to 8-membered ring, more preferably a 5- to 7-membered ring, and still more preferably a 5- or 6-membered ring.

From the viewpoint that the effects of the present invention are more excellent, the number of carbon atoms constituting the ring formed by $R^{B11}$ and $R^{B12}$ being linked to each other is preferably in a range of 3 to 7 and more preferably in a range of 3 to 6.

The ring formed by $R^{B11}$ and $R^{B12}$ being linked to each other may or may not have aromaticity, but it is preferable that the ring does not have aromaticity from the viewpoint that the effects of the present invention are more excellent.

Specific examples of the ring formed by $R^{B11}$ and $R^{B12}$ being linked to each other include the following groups.

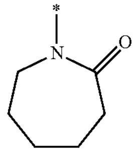
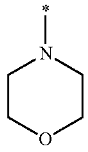
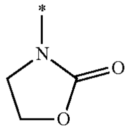
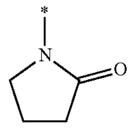

$R^{B13}$ represents a hydrogen atom, an alkyl group having 1 to 5 carbon atoms, a halogen atom, or a cyano group, preferably a hydrogen atom or an alkyl group having 1 to 5 carbon atoms, and more preferably a hydrogen atom.

The number of carbon atoms in the alkyl group is in a range of 1 to 5, preferably in a range of 1 to 3, and more preferably 1. The alkyl group may have a linear, branched, or cyclic structure.

Specific examples of the repeating structure B3 are shown below, but the repeating structure B3 is not limited to the following structures.

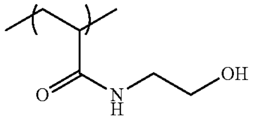
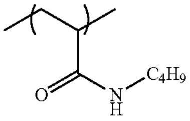
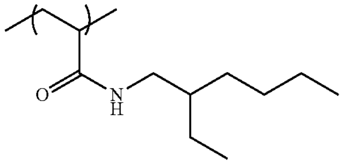
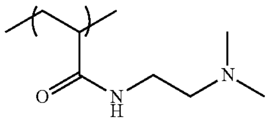
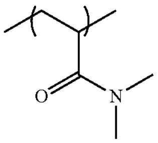
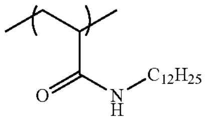
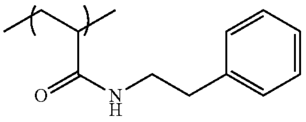
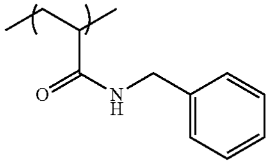
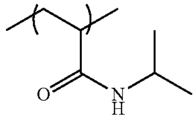

-continued

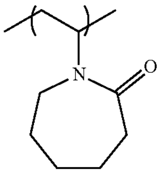
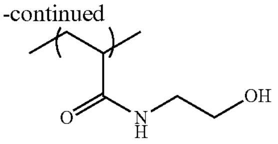
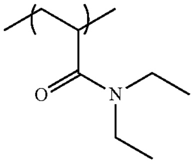
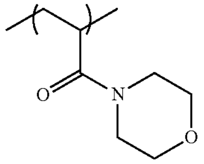
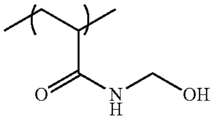
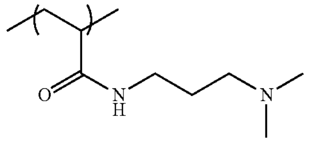
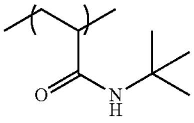
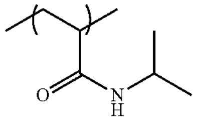
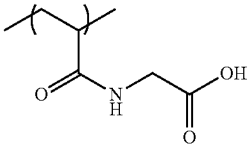
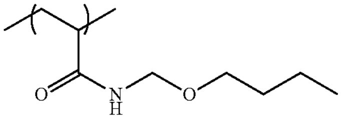
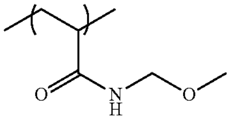
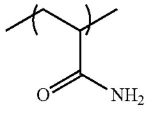
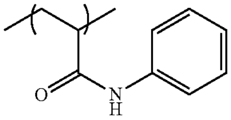
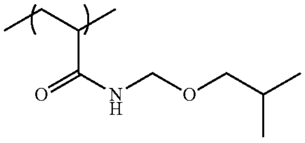
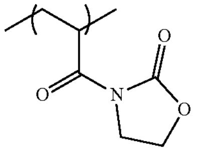
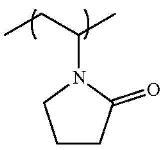
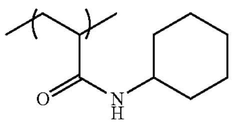
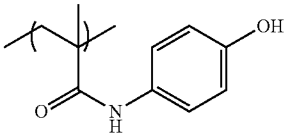
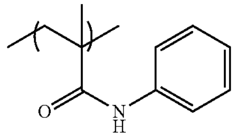
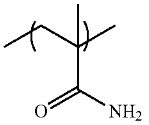
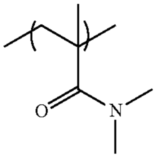

-continued

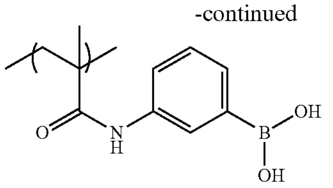

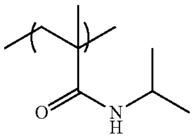

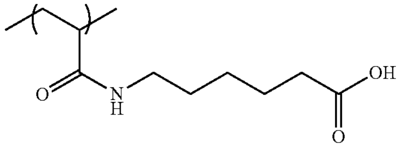

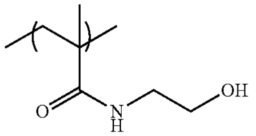

The content of the repeating structure B3 is preferably in a range of 3% to 75% by mass, more preferably in a range of 15% to 70% by mass, and still more preferably in a range of 20% to 65% by mass with respect to the total mass of all repeating structures of the fluorine-containing polymer. In a case where the content of the repeating structure B3 is in the above-described ranges, the effects of the present invention are more excellent.

The surfactant may have only one or two or more kinds of repeating structures B3. In a case where the surfactant has two or more kinds of repeating structures B3, the above-described content of the repeating structure B3 denotes the total content of the repeating structures B3.

(Other Repeating Structures (No. 1))

The fluorine-containing polymer may further have a repeating structure represented by General Formula (M-3).

(M-3)

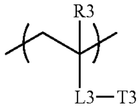

In Formula (M-3), $R^3$ represents a hydrogen atom, a fluorine atom, a chlorine atom, or an alkyl group having 1 to 20 carbon atoms, L3 represents a single bond or a divalent linking group, and T3 represents an aromatic ring.

As the linking group represented by L3, a single bond or a linear, branched, or cyclic alkylene group having 1 to 10 carbon atoms is preferable. Here, the carbon atoms of the alkylene group may be substituted with —O—, —S—, —N(Z)—, —C(Z)═C(Z')—, —C(O)—, —C(S). —OC(O)—, —OC(S)—, —SC(O)—, —C(O)O—, —C(S)O—, —C(O)S—, —O—C(O)O—, —N(Z)C(O)—, or —C(O)N(Z)—, (Z and Z' each independently represent a hydrogen atom, an alkyl group having 1 to 4 carbon atoms, a cycloalkyl group, an aryl group, a cyano group, or a halogen atom). Further, the hydrogen atom of the alkylene group may be substituted with a fluorine atom or a fluoroalkyl group.

Examples of the aromatic ring group as T3 include an aromatic hydrocarbon ring group such as a benzene ring group, a naphthalene ring group, an anthracene ring group, or a phenanthroline ring group, and an aromatic heterocyclic group such as a furan ring group, a pyrrole ring group, a thiophene ring group, a pyridine ring group, a thiazole ring group, or a benzothiazole ring group. Among these, a benzene ring group (for example, a 1,4-phenyl group) is preferable. The compatibility can be improved by allowing the polymer to contain these groups.

Specific examples of the monomer forming a repeating structure represented by Formula (M-3) include monomers represented by Formulae (M3-1) to (M3-5), but the present invention is not limited thereto.

(M3-1)

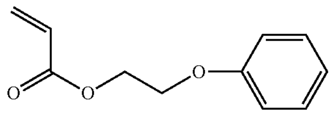

(M3-2)

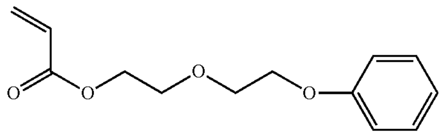

(M3-3)

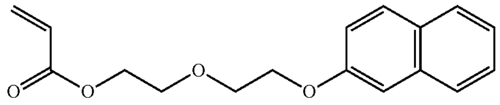

(M3-4)

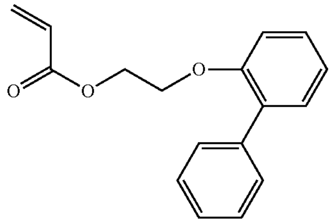

(M3-5)

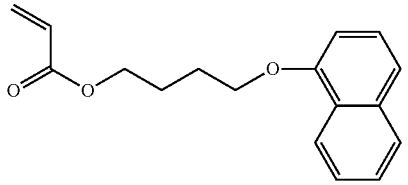

(Other Repeating Structures (No. 2))

The fluorine-containing polymer may further have a repeating structure represented by General Formula (M-4).

(M-4)

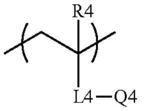

In Formula (M-4), $R^4$ represents a hydrogen atom, a fluorine atom, a chlorine atom, or an alkyl group having 1 to 20 carbon atoms, L4 represents a single bond or a divalent linking group, and Q4 represents a crosslinkable group represented by any of Formulae (P-1) to (P-30).

In Formulae (P-1) to (P-30), $R^P$ represents a hydrogen atom, a halogen atom, a linear, branched, or cyclic alkylene group having 1 to 10 carbon atoms, a halogenated alkyl group having 1 to 20 carbon atoms, an alkoxy group having 1 to 20 carbon atoms, an alkenyl group having 1 to 20 carbon atoms, an alkynyl group having 1 to 20 carbon atoms, an aryl group having 1 to 20 carbon atoms, a heterocyclic group, a cyano group, a hydroxy group, a nitro group, a carboxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group ($-B(OH)_2$), a phosphate group ($-OPO(OH)_2$), or a sulfate group ($-OSO_3H$), and a plurality of $R^P$'s may be the same as or different from each other.

(P-1)

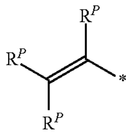

(P-2)

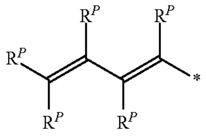

(P-3)

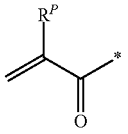

(P-4)

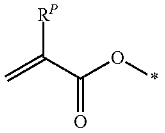

(P-5)

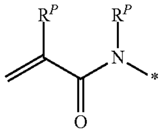

(P-6)

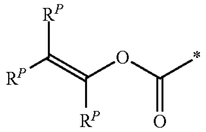

(P-7)

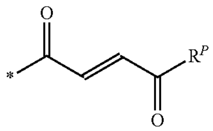

-continued (P-8)

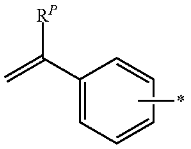

(P-9)

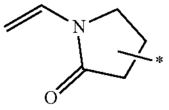

(P-10)

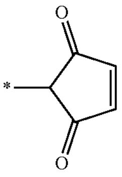

(P-11)

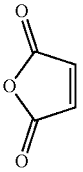

(P-12)

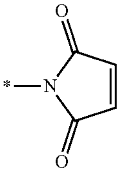

(P-13)

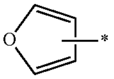

(P-14)

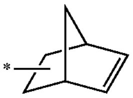

(P-15)

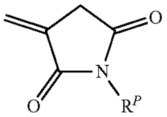

(P-16)

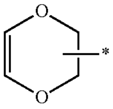

(P-17)

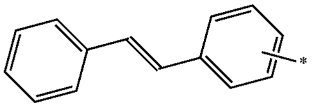

(P-18)

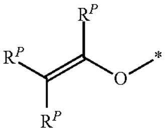

-continued (P-19)

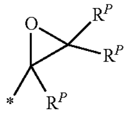

(P-20)

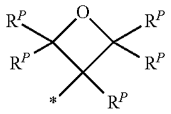

(P-21)

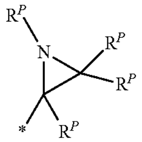

(P-22)

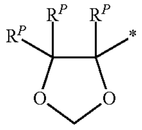

(P-23)

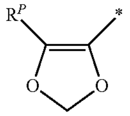

(P-24)

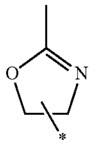

(P-25)

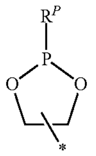

(P-26)

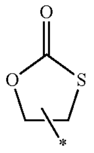

(P-27)

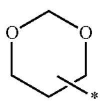

(P-28)

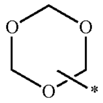

(P-29)

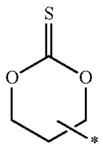

-continued (P-30)

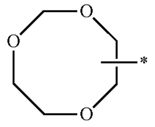

Examples of the linking group as L4 include an aromatic hydrocarbon group having 4 to 20 carbon atoms, a cyclic alkylene group having 4 to 20 carbon atoms, and a heterocyclic group having 1 to 20 carbon atoms. Among these, a linear, branched, or cyclic alkylene group having 1 to 20 carbon atoms, and an aromatic hydrocarbon group having 4 to 20 carbon atoms are preferable, and it is preferable that the linking group contains —O—, —CO—O—, —CO—NH—, or —O—CO—.

In a case where Q4 represents a group containing a cationically polymerizable group, the cationically polymerizable group is not particularly limited, and examples thereof include an alicyclic ether group, a cyclic acetal group, a cyclic lactone group, a cyclic thioether group, a spiroorthoester group, and a vinyloxy group.

As the cationically polymerizable group, an alicyclic ether group or a vinyl oxy group is preferable, an epoxy group, an oxetanyl group, or a vinyloxy group is more preferable, an epoxy group or an oxetanyl group is still more preferable, and an epoxy group is particularly preferable. An alicyclic epoxy group is particularly preferable as the epoxy group. Further, each of the above-described groups may have a substituent.

In a case where Q4 represents a group containing a radically polymerizable group, the radically polymerizable group is not particularly limited, and examples thereof include a group having a polymerizable carbon-carbon double bond, and specific examples thereof include a (meth)acryloyl group, a (meth)acryloyloxy group, a (meth)acrylamide group, a vinyl group, a styryl group, and an allyl group. Among these, a (meth)acryloyloxy group is preferable. Further, each of the above-described groups may have a substituent. In a case of containing the above-described groups, the adhesiveness between layers while a plurality of layers in an optical film described below are laminated can be improved.

Specific examples of the monomer forming a repeating structure represented by Formula (M-4) include monomers represented by Formulae (M4-1) to (M4-17), but the present invention is not limited thereto.

(M4-1)

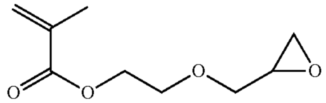

(M4-2)

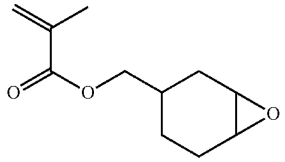

-continued (M4-3)

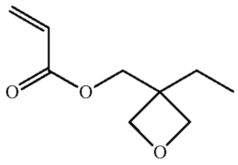

(M4-4)

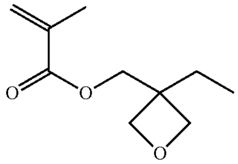

(M4-5)

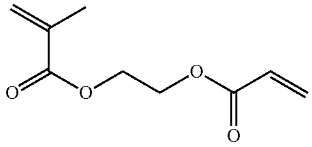

(M4-6)

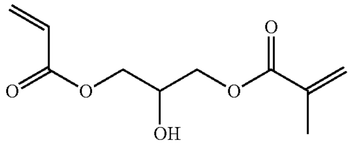

(M4-7)

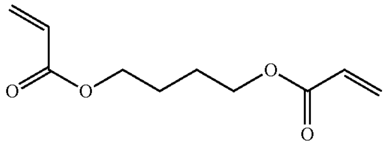

(M4-8)

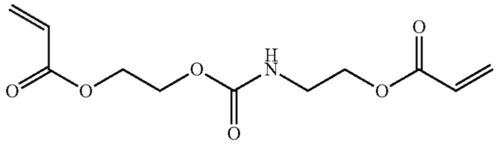

(M4-9)

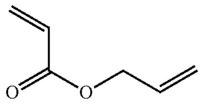

(M4-10)

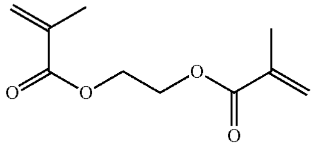

(M4-11)

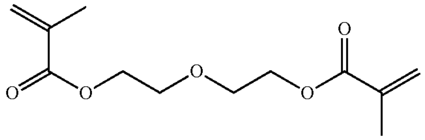

(M4-12)

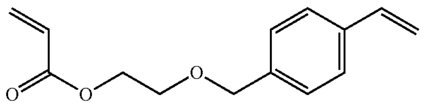

-continued (M4-13)

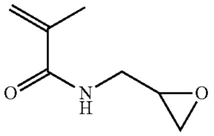

(M4-14)

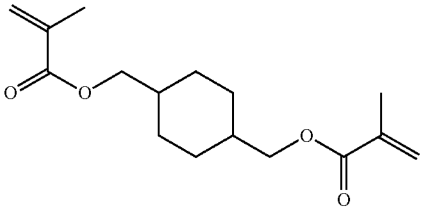

(M4-15)

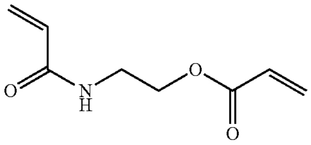

(M4-16)

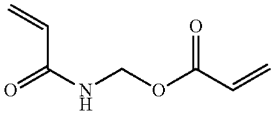

(M4-17)

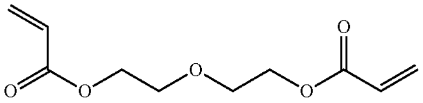

The fluorine-containing polymer may be a polymer having a block structure, a graft structure, a branch structure, or a star structure. It is preferable that the fluorine-containing polymer has such a block structure, a graft structure, a branch structure, or a star structure from the viewpoint that fluorine atomic groups are present lumps and the transferability of the polymer to the coating film surface is improved.

Further, in a copolymer having a random structure with a fluorine-substituted alkyl chain length of 1 to 4, the lumps of fluorine atomic groups are small and the solubility in a general-purpose solvent is excellent, but the transferability to a coating film surface is degraded. Since the fluorine atomic groups are present as lumps, the transferability of the polymer to the coating film surface is high even in a case where the fluorine-substituted alkyl chain length is in a range of 1 to 4, and thus it is preferable that such a copolymer is added to the composition from the viewpoint of reducing the surface tension of the coating film and enhancing the wettability (homogeneous coating property) of the composition to the base material during coating and the surface state of the coating film surface.

In a case where the liquid crystal composition contains a surfactant, the content of the surfactant is preferably in a range of 0.001 to 5 parts by mass and more preferably in a range of 0.01 to 3 parts by mass with respect to 100 parts by mass which is the total amount of the dichroic coloring agent compound and the liquid crystal compound in the liquid crystal composition.

The surfactant may be used alone or in combination of two or more kinds thereof. In a case where the composition contains two or more kinds of surfactants, it is preferable that the total amount of the surfactants is in the above-described ranges.

[Adhesion Improver]

The liquid crystal composition may contain an adhesion improver from the viewpoint of the adhesiveness to a protective layer described below. Examples of the adhesion improver include a compound containing a hydroxyl group, a carboxyl group, and a boronic acid group, and a compound containing a boronic acid group is preferable.

Suitable examples of the compound containing a boronic acid group include a compound represented by the following formula.

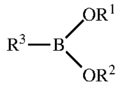

(In the formula, $R^1$ and $R^2$ each independently represent a hydrogen atom, a substituted or unsubstituted aliphatic hydrocarbon group, a substituted or unsubstituted aryl group, or a substituted or unsubstituted heterocyclic group, and $R^3$ represents a substituent containing a functional group that can be bonded to a (meth)acrylic group.)

[Solvent]

From the viewpoint of workability and the like, it is preferable that the liquid crystal composition contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tetrahydropyran, and dioxolanes), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water. These solvents may be used alone or in combination of two or more kinds thereof.

Among these solvents, from the viewpoint of exhibiting the effect of the excellent solubility of the liquid crystal composition, ketones (particularly cyclopentanone and cyclohexanone), ethers (particularly tetrahydrofuran, cyclopentyl methyl ether, tetrahydropyran, and dioxolane), and amides (particularly dimethylformamide, dimethylacetamide, N-methylpyrrolidone, and N-ethylpyrrolidone) are preferable.

In a case where the liquid crystal composition contains a solvent, the content of the solvent is preferably in a range of 80% to 99% by mass, more preferably in a range of 83% to 97% by mass, and still more preferably in a range of 85% to 95% by mass with respect to the total mass of the liquid crystal composition.

These solvents may be used alone or in combination of two or more kinds thereof. In a case where the composition contains two or more kinds of solvents, it is preferable that the total amount of the solvents is in the above-described range.

The thickness of the light absorption anisotropic film is not limited, and may be appropriately set to a thickness at which required polarization characteristics can be obtained, depending on the forming material and the like.

The thickness of the light absorption anisotropic film is preferably in a range of 0.1 to 5 μm and more preferably in a range of 0.3 to 2.5 μm. As described below, in a case where the light absorption anisotropic film has steps (thickness distribution), the thickness described above is the thickness at the thickest place of the film.

<Method of Forming Light Absorption Anisotropic Layer>

A method of forming the light absorption anisotropic film formed of the liquid crystal composition described above is not limited, and various known film-forming methods using a composition can be used.

Examples of the method of forming the light absorption anisotropic film include a method including a step of coating a support with the above-described liquid crystal composition to form a coating film and a step of aligning a liquid crystal compound contained in the coating film in this order. In the following description, the step of coating a support with the liquid crystal composition to form a coating film will also be referred to as "coating film forming step". The step of aligning a liquid crystal compound contained in the coating film will also be referred to as "aligning step".

Further, the liquid crystal compound is a component that also contains a dichroic coloring agent compound having liquid crystallinity in a case where the above-described dichroic coloring agent compound has liquid crystallinity, in addition to the above-described liquid crystal compound.

Here, in the display device according to the embodiment of the present invention, the light absorption anisotropic film of the optical film has, in the same film surface, a region A where an inclination of an absorption axis with respect to the film surface is θA and a region B where an inclination of an absorption axis with respect to the film surface is θB, and θA and θB satisfy the relationships of Expressions (1) and (2).

$$|\theta A - \theta B| \geq 10° \quad \text{Expression (1)}$$

$$0° \leq \theta B \leq 5° \quad \text{Expression (2)}$$

Therefore, the region A and the region B of the light absorption anisotropic film are formed in the same film surface with pattern formation. The pattern formation will be described in detail below.

[Coating Film Forming Step]

The coating film forming step is a step of coating a support with a liquid crystal composition to form a coating film.

The support is easily coated with the liquid crystal composition by using the liquid crystal composition containing the above-described solvent or using a liquid-like material such as a melt obtained by heating the liquid crystal composition.

Examples of a method of coating a support with a liquid crystal composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

In the present example, an example in which a support is coated with a liquid crystal composition is described, but the present invention is not limited thereto, and for example, an alignment film provided on the support may be coated with the liquid crystal composition.

The alignment film will be described below.

[Aligning Step]

The aligning step is a step of aligning the liquid crystal compound contained in the coating film.

The aligning step may include a drying treatment. Components such as a solvent can be removed from the coating film by performing the drying treatment. The drying treatment may be performed by a method of allowing the coating film to stand at room temperature for a predetermined time (for example, natural drying) or a method of heating the coating film and/or blowing air to the coating film.

Here, the liquid crystal compound contained in the liquid crystal composition may be aligned by performing the above-described coating film forming step or drying treatment. For example, in an aspect in which the liquid crystal composition is prepared as a coating solution containing a solvent, a polarizing layer is obtained by drying the coating film and removing the solvent from the coating film.

In a case where the drying treatment is performed at a temperature higher than or equal to the transition temperature of the liquid crystal compound contained in the coating film to the liquid crystal phase, the heat treatment described below may not be performed.

The transition temperature of the liquid crystal compound contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. Since the liquid crystal compound contained in the coating film can be aligned by performing the heat treatment, the coating film after being subjected to the heat treatment can be suitably used as the light absorption anisotropic film.

The temperature and the time of the heat treatment are not limited, and the treatment temperature and the time, at which the liquid crystal compound can be suitably aligned, may be appropriately set depending on the liquid crystal compound, the dichroic coloring agent, and the like contained in the coating film. From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (approximately 20° C. to 25° C.). In this manner, the alignment of the liquid crystal compound contained in the coating film can be fixed.

A method of performing the cooling treatment is not limited, and various known methods of cooling a sheet-like material can be used.

A light absorption anisotropic film having the region A and the region B with different absorption axes in the plane can be formed by combining the above-described step with a pattern forming method described below.

In the above-described example, a drying treatment, a heat treatment, or the like is exemplified as the method of aligning the liquid crystal compound contained in the coating film, but the method of aligning the liquid crystal compound in the present invention is not limited thereto and can be performed by a known alignment treatment.

[Curing Step]

In the formation of the light absorption anisotropic film, a curing step of curing the light absorption anisotropic film may be carried out after the aligning step described above.

The curing step is performed by, for example, heating the film and/or irradiating (exposing) the film with light. Among the examples, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

In a case where the film is irradiated with ultraviolet rays or the like while being heated, the heating temperature is not limited and may be appropriately set depending on the transition temperature of the liquid crystal compound contained in the light absorption anisotropic film to the liquid crystal phase and the like. The heating temperature is preferably 25° C. to 140° C.

In addition, the film may be irradiated with light in a nitrogen atmosphere in the curing step. In a case where the curing of the light absorption anisotropic film proceeds by radical polymerization, since the inhibition of polymerization due to oxygen is reduced, it is preferable that the film is irradiated with light in a nitrogen atmosphere.

As described above, the optical film according to the embodiment of the present invention includes the light absorption anisotropic film, but may further include other layers such as a transparent support, an alignment film, an oxygen blocking layer, and a surface protective layer in addition to the light absorption anisotropic film. For example, it is preferable that the optical film includes at least one alignment film and at least one light absorption anisotropic film and more preferable that the optical film further includes at least one oxygen blocking layer in addition to the alignment film and the light absorption anisotropic film.

Hereinafter, each layer included in the optical film will be described.

[Transparent Support]

The transparent support is not particularly limited, and a polymer film that is commonly used (for example, a polarizer protective film) or a glass base material can be used. In the applications where flexibility is required, a polymer film or a glass base material having a thickness of 100 μm or less is preferably used.

Specific examples of the polymer constituting the polymer film include a cellulose-based polymer, an acrylic polymer containing an acrylic acid ester polymer such as polymethyl methacrylate or a lactone ring-containing polymer, a thermoplastic norbornene-based polymer, a polycarbonate-based polymer, a polyester-based polymer such as polyethylene terephthalate or polyethylene naphthalate, a styrene-based polymer such as polystyrene or an acrylonitrile-styrene copolymer (AS resin), a polyolefin-based polymer such as polyethylene, polypropylene, or an ethylene-propylene copolymer, a vinyl chloride-based polymer, an amide-based polymer such as nylon or aromatic polyamide, an imide-based polymer, a sulfone-based polymer, a polyether sulfone-based polymer, a polyether ether ketone-based polymer, a polyphenylene sulfide-based polymer, a vinylidene chloride-based polymer, a vinyl alcohol-based polymer, a vinyl butyral-based polymer, an arylate-based polymer, a polyoxymethylene-based polymer, an epoxy-based polymer, and a polymer obtained by mixing such polymers.

Among these, a cellulose-based polymer represented by triacetyl cellulose (hereinafter, also referred to as "cellulose acylate") can be preferably used.

Further, from the viewpoint of workability and optical performance, an acrylic polymer is also preferably used.

Examples of the acrylic polymer include polymethyl methacrylate and the lactone ring-containing polymer and the like described in paragraphs [0017] to [0107] of JP2009-098605A.

In the present invention, from the viewpoint of reducing the thickness, it is also preferable that the transparent support is peeled off from the optical film. In an aspect of using a peelable polymer film, a cellulose-based polymer or a polyester-based polymer can be preferably used.

Further, in the present invention, it is preferable that the transparent support is transparent.

Here, the term "transparent" in the present invention indicates that the transmittance of visible light is 60% or greater, preferably 80% or greater, and particularly preferably 90% or greater.

The thickness of the transparent support is not particularly limited, but is preferably 40 μm or less from the viewpoint that the thickness of the optical laminate can be reduced. The lower limit is not particularly limited, but is typically 5 μm or greater.

[Alignment Film]

Examples of the kind of the alignment film include a photo-alignment layer and a rubbing treatment alignment layer. Among these, from the viewpoint that the effects of the present invention are more excellent, a photo-alignment layer is preferable. Examples of the photo-alignment layer include the examples described in paragraphs [0018] to [0078] of WO2020/179864A.

[Oxygen Blocking Layer]

The optical film may include an oxygen blocking layer for the purpose of improving the durability. It is preferable that the oxygen blocking layer is provided on a side of the light absorption anisotropic film opposite to the alignment film.

Here, the oxygen blocking layer is an oxygen blocking film with an oxygen blocking function, and specific examples thereof include layers containing organic compounds such as polyvinyl alcohol, polyethylene vinyl alcohol, polyvinyl ether, polyvinylpyrrolidone, polyacrylamide, polyacrylic acid, cellulose ether, polyamide, polyimide, a styrene/maleic acid copolymer, gelatin, vinylidene chloride, and cellulose nanofibers.

In the present specification, the oxygen blocking function is not limited to a function for making a state where oxygen is not allowed to pass at all, and also includes a function for making a state where a small amount of oxygen is allowed to pass depending on the desired performance.

In a case where an oxygen blocking layer is provided on a transparent polymer film and a photo-alignment layer is provided on the oxygen blocking layer, from the viewpoint of enhancing the aligning properties, it is preferable that polyvinyl alcohol having a saponification degree of 95 mol % or greater or modified polyvinyl alcohol having a saponification degree of 95 mol % or greater is used as the oxygen blocking layer.

Further, examples of the oxygen blocking layer also include a thin layer consisting of a metal compound (metal compound thin layer). As a method of forming the metal compound thin layer, any method can be used as long as a desired thin layer can be formed. Suitable examples thereof include a sputtering method, a vacuum deposition method, an ion plating method, and a plasma chemical vapor deposition (CVD) method. Specifically, the forming methods described in JP3400324B, JP2002-322561A, and JP2002-361774A can be employed.

The component contained in the metal compound thin layer is not particularly limited as long as the component can exhibit an oxygen blocking function, and an oxide, a nitride, an oxynitride, or the like containing one or more metals selected from Si, A1, In, Sn, Zn, Ti, Cu, Ce, Ta and the like can be used. Among these, an oxide, a nitride, or an oxynitride of a metal selected from Si, A1, In, Sn, Zn, and Ti is preferable, and an oxide, a nitride, or an oxynitride of a metal selected from Si, A1, Sn, and Ti is particularly preferable. These may contain other elements as secondary components.

Further, the oxygen blocking layer may be in the form of lamination of the layer containing an organic material and the metal compound thin layer as described in, for example, U.S. Pat. No. 6,413,645B, JP2015-226995A, JP2013-202971A, JP2003-335880A, JP1978-012953B (JP-553-012953B), and JP1983-217344A (JP-558-217344A) and may be a layer obtained by hybridizing an organic compound and an inorganic compound as described in WO2011/11836A, JP2013-248832A, and JP3855004B.

In a case where the optical laminate according to the embodiment of the present invention is a retardation film which has a λ/4 plate described below and in which the λ/4 plate is provided with an optically anisotropic layer having a λ/4 function on a support, the oxygen blocking layer may also serve as an alignment layer of an optically anisotropic layer having a λ/4 function. In such a case, an oxygen blocking layer containing polyvinyl alcohol, polyamide, or polyimide is preferable.

[Thickness of Oxygen Blocking Layer]

The thickness of the oxygen blocking layer is not particularly limited, but in a case where the layer contains an organic compound, the thickness of the oxygen blocking layer is preferably in a range of 0.1 to 10 μm and more preferably in a range of 0.5 to 5.5 μm from the viewpoint that the effects of the present invention are more excellent. In a case of the metal compound thin layer, the thickness of the oxygen blocking layer is preferably in a range of 5 nm to 500 nm and more preferably in a range of 10 nm to 200 nm from the viewpoint that the effects of the present invention are more excellent.

[Protective Layer]

The optical film according to the embodiment of the present invention may include a surface protective layer on the most viewing side. The surface protective layer is not limited as long as the layer has a function of protecting the surface. The surface protective layer may be formed of one layer and preferably a plurality of layers. It is preferable that the surface protective layer has a high hardness and also preferable that the surface protective layer has an excellent recovery property. A low-reflection layer that suppresses surface reflection that occurs at the air interface is also preferable.

The configuration of the transparent support and the surface coating layer is assumed as one of the preferred embodiments. A support described in the section of the transparent support above can be similarly used as the transparent support.

Hereinafter, the surface coating layer will be described.

[Surface Coating Layer]

Examples of the surface coating layer include at least one selected from the group consisting of an antireflection layer, an antiglare layer, and a hard coat layer. Known layer materials are used for the antireflection layer, the antiglare layer, and the hard coat layer. In addition, these layers may be formed by laminating a plurality of layers.

The antireflection layer indicates a structure that is different from an antireflection plate of a so-called circularly polarizing plate and that reduces reflection by a structure using light interference. The antireflection layer may have a configuration consisting of only a low refractive index layer as the simplest configuration. In order to further reduce the reflectivity, it is preferable that an antireflection layer is formed by combining a high refractive index layer having a high refractive index and a low refractive index layer having a low refractive index. Examples of the configuration thereof include a configuration in which two layers of a high refractive index layer and a low refractive index layer are laminated in order from the lower side and a configuration in which three layers with different refractive indices are laminated in order of a medium refractive index layer (layer with a higher refractive index than that of the lower layer and with a lower refractive index than that of the high refractive index layer), a high refractive index layer, and a low refractive index layer. Further, a configuration in which a plurality of antireflection layers are laminated has been suggested. Among these, from the viewpoints of the durability, the optical characteristics, the cost, and the productivity, a configuration in which a medium refractive index layer, a high refractive index layer, and a low refractive index layer are sequentially laminated on a hard coat layer is preferable, and examples thereof include the configurations described in JP1996-122504A (JP-H08-122504A), JP1996-110401A (JP-H08-110401A), JP1998-300902A (JP-H10-300902A), JP2002-243906A, JP2000-111706A, and the like. Further, an antireflection film having a three-layer configuration with excellent robustness with respect to fluctuations in film thickness is described in JP2008-262187A. In a case where the antireflection film having the above-described three-layer configuration is provided on the surface of an image display device, the average value of the reflectivity can be set to 0.5% or less, the reflected glare can be significantly reduced, and an image with an excellent stereoscopic effect can be obtained. In addition, other functions may be imparted to each layer, and examples thereof include an antifouling low refractive index layer, an antistatic high refractive index layer, an antistatic hard coat layer, and an antiglare hard coat layer (the layers described in JP1998-206603A (JP-H10-206603A), JP2002-243906A, JP2007-264113A, and the like).

As one embodiment of the present invention, as the foldable organic EL display device, the description of JP2018-56069A can be referred to except for the polarizer. A surface film is required because cover glass cannot be used. For example, paragraphs [0030] to [0040] describe that a polyimide-based resin is preferable as a base material having a curvature radius of 3 mm or less (for example, 3 mm, 2 mm, or 1 mm) and bending properties such that the base material can be bent preferably 200,000 times, more preferably 300,000 times, and still more preferably 500,000 times and that an organic-inorganic hybrid material obtained by blending silica particles and a cage-like silsesquioxane compound with an ultraviolet-curable acrylic resin is preferable as a hard coat layer.

As the surface protective layer of the present invention, a hard coat layer formed of a silsesquioxane compound having a structure described in JP2015-212353A, JP2017-008148A, and the like is preferable.

<Optical Laminate>

As illustrated in FIG. 1, the optical laminate according to the embodiment of the present invention includes an optical film 20 having a light absorption anisotropic film 18 and at least a λ/4 plate 14. With the above-described combination, the antireflection effect of external light can be effectively obtained.

[λ/4 Plate]

In the present invention, "λ/4 plate" is a plate (λ/4 wavelength plate) having a λ/4 function, specifically, a plate having a function of converting linearly polarized light having a specific wavelength into circularly polarized light (or converting circularly polarized light into linearly polarized light).

Specific examples of the λ/4 plate include those described in US2015/0277006A.

For example, specific examples of a form in which the λ/4 plate has a single-layer structure include a stretched polymer film and a retardation film in which an optically anisotropic layer having a λ/4 function is provided on a support. Further, specific examples of a form in which the λ/4 plate has a multilayer structure include a broadband λ/4 plate obtained by laminating a λ/4 plate and a λ/2 plate.

It is more preferable that the retardation film provided with the optically anisotropic layer having a λ/4 function is a retardation film formed of one or more layers containing at least one liquid crystal compound (such as a disk-like liquid crystal compound or a rod-like liquid crystal compound) formed by polymerizing a liquid crystal monomer exhibiting a nematic liquid crystal layer or a smectic liquid crystal layer.

Further, it is still more preferable to use a liquid crystal compound having reverse wavelength dispersibility as the λ/4 plate having excellent optical performance. Specifically, the liquid crystal compound represented by General Formula (II) described in WO2017/043438A is preferably used. In regard to a method of preparing the λ/4 plate formed of a liquid crystal compound having reverse wavelength dispersibility, the description of Examples 1 to 10 of WO2017/043438A and Example 1 of JP2016-91022A can be referred to.

[Other Retardation Layers]

The optical laminate according to the embodiment of the present invention may include other retardation layers in addition to the λ/4 plate. Examples of the other retardation layers include a C-plate. The C-plate is classified into two kinds of C-plates, a positive C-plate and a negative C-plate. The positive C-plate satisfies the relationship of Expression (C1), and the negative C-plate satisfies the relationship of Expression (C2). Further, the Rth of the positive C-plate represents a negative value, and the Rth of the negative C-plate represents a positive value.

$$nz>nx\approx ny \qquad \text{Expression (C1)}$$

$$nz<nx\approx ny \qquad \text{Expression (C2)}$$

The symbol "≈" includes not only a case where both are completely the same as each other but also a case where both are substantially the same as each other. The expression "substantially the same" denotes that "nx≈ny" includes a case where (nx−ny)×d (where d represents the thickness of the film) is in a range of 0 to 10 nm and preferably in a range of 0 to 5 nm.

[Pressure Sensitive Adhesive Layer]

The optical laminate according to the embodiment of the present invention may include a pressure sensitive adhesive layer between the optical film and the λ/4 plate described above.

Examples of the pressure sensitive adhesive contained in the pressure sensitive adhesive layer include a rubber-based pressure sensitive adhesive, an acrylic pressure sensitive adhesive, a silicone-based pressure sensitive adhesive, a urethane-based pressure sensitive adhesive, a vinyl alkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive.

Among these, an acrylic pressure sensitive adhesive is preferable from the viewpoints of the transparency, the weather fastness, the heat resistance, and the like.

The pressure sensitive adhesive layer can be formed by a method of coating a release sheet with a solution of a pressure sensitive adhesive, drying the solution, and transferring the sheet to a surface of a transparent resin layer or a method of directly coating a surface of a transparent resin layer with a solution of a pressure sensitive adhesive and drying the solution.

A solution of a pressure sensitive adhesive is prepared as a 10 to 40 mass % solution obtained by dissolving or dispersing the pressure sensitive adhesive in a solvent such as toluene or ethyl acetate.

As a coating method, a roll coating method such as reverse coating or gravure coating, a spin coating method, a screen coating method, a fountain coating method, a dipping method, or a spraying method can be employed.

Examples of the constituent material of the release sheet include appropriate thin paper bodies, for example, synthetic resin films such as polyethylene, polypropylene, and polyethylene terephthalate, rubber sheets, paper, cloth, nonwoven fabrics, nets, foam sheets, and metal foils.

In the present invention, the thickness of an optional pressure sensitive adhesive layer is not particularly limited, but is preferably in a range of 3 μm to 50 μm, more preferably in a range of 4 μm to 40 μm, and still more preferably in a range of 5 μm to 30 μm.

In a display device 10 according to the embodiment of the present invention, the thickness of the optical film 20 is not limited and may be appropriately set depending on the configuration of the optical film, the material for forming the optical film, and the like. The thickness of the optical film 20 is preferably in a range of 1 to 100 more preferably in a range of 1 to 30 and still more preferably in a range of 1 to 10 μm.

Here, in the display device 10 according to the embodiment of the present invention, it is preferable that the total thickness of the λ/4 plate 14 and the optical film 20 is 20 μm or less.

In a case where the total thickness of the λ/4 plate 14 and the optical film 20 is set to 20 μm or less, an EL substrate 12 and the light absorption anisotropic film 18 approach each other, the expected angle from the light emitting element to the region A is increased, and thus the utilization efficiency of light emitted by the light emitting element can be improved.

Further, the thickness of the optical film can be measured by a contact type film thickness meter of the related art. Alternatively, the thickness thereof may be directly measured by observing a cross section of the optical film with a microscope or a scanning electron microscope (SEM). In a case where the film thickness is acquired by observing a cross section, for example, the cross-section is cut in the film thickness direction using a rotary microtome RM2265 (manufactured by Leica) and observed with a polarization microscope LV100-POL (manufactured by Nikon Corporation).

The optical film 20 in the illustrated example of the figure has a configuration in which the light absorption anisotropic film 18 is formed on the surface of the support 16, but the present invention is not limited thereto.

As an example, a configuration in which the optical film 20 does not have the support 16 and the light absorption anisotropic film 18 or the like is directly formed on the λ/4 plate 14 may be used. That is, the display device according to the embodiment of the present invention may have a configuration in which the optical film 20 is formed of only the light absorption anisotropic film 18. Alternatively, an alignment film may be formed on the λ/4 plate 14, and the light absorption anisotropic film 18 may be formed on the surface of the alignment film.

With such a configuration, the total thickness of the λ/4 plate 14 and the optical film 20 can be suitably set to be 20 μm or less.

<Image Display Device>

FIG. 1 is a conceptual view illustrating an example of the image display device according to the embodiment of the present invention. In the description below, the image display device according to the embodiment of the present invention will also be simply referred to as a display device.

The display device 10 illustrated in FIG. 1 is a self-emission type display device formed of an inorganic EL light emitting element or the like as described above and includes an EL substrate 12, a λ/4 plate 14, and an optical film 20.

The optical film 20 includes the support 16 and the light absorption anisotropic film 18. The light absorption anisotropic film 18 has two regions, the region A and the region B, with different inclinations of the absorption axes with respect to the film surface in the same film surface. That is, in the light absorption anisotropic film 18, the region 18A is the region A in the present invention, and the region 18B is the region B in the present invention.

[E1 Substrate]

The EL substrate 12 is a known EL substrate including an EL light emitting element, which is used in an inorganic EL display device, an organic EL display device, and the like.

The display device 10 in the illustrated example of the figure is for displaying a full color image, and the EL substrate 12 includes an R light emitting element 12R that emits red light, a G light emitting element 12G that emits green light, and a B light emitting element 12B that emits blue light. In the description below, in a case where it is not necessary to distinguish the R light emitting element 12R, the G light emitting element 12G, and the B light emitting element 12B from each other, the R light emitting element 12R, the G light emitting element 12G, and the B light emitting element 12B are collectively referred to as "light emitting element".

Similarly to a known EL substrate, the EL substrate 12 is formed such that a plurality of such R light emitting elements 12R, G light emitting elements 12G, and B light emitting elements 12B are two-dimensionally arranged.

In the present invention, various known EL substrates used in a self-emission type display device formed of an inorganic EL light emitting element, an organic EL light emitting element, or the like can be used as the EL substrate 12.

Figure 4:
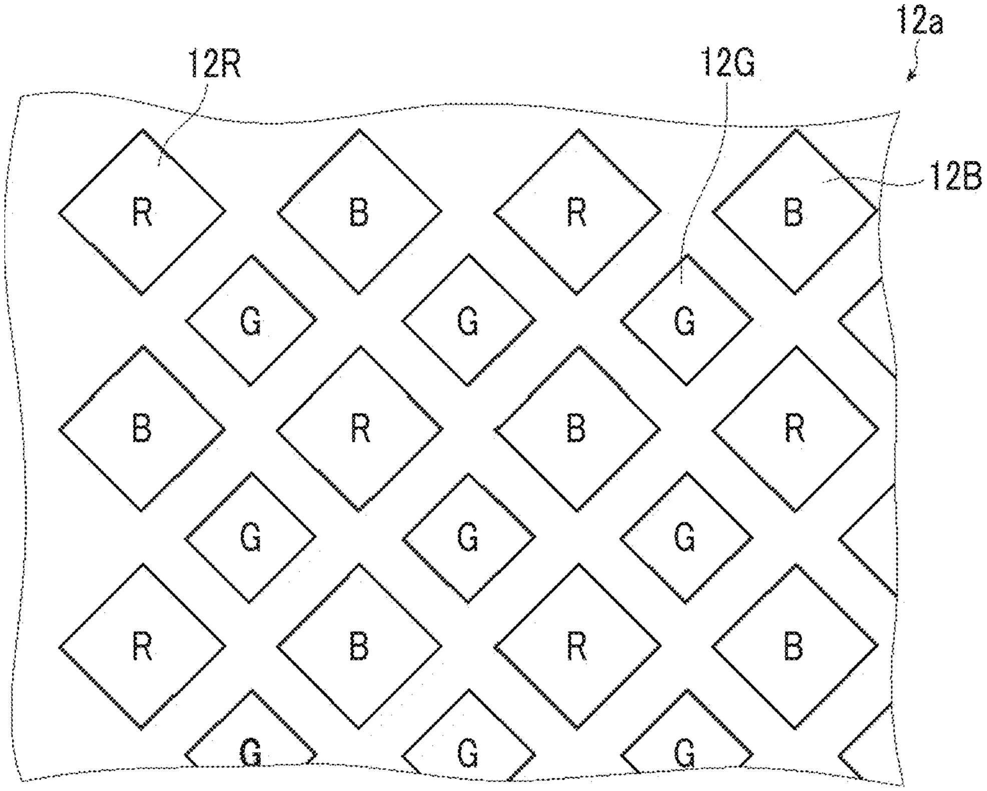
FIG. 4 is a view conceptually illustrating an example of an EL substrate used in the image display device of the present invention.

Therefore, the EL substrate 12 may be formed such that the R light emitting element 12R, the G light emitting element 12G, and the B light emitting element 12B using an organic EL (organic light emitting diode (OLED)) are arranged, as in an EL substrate 12*a* conceptually illustrated in FIG. 4.

Figure 5:
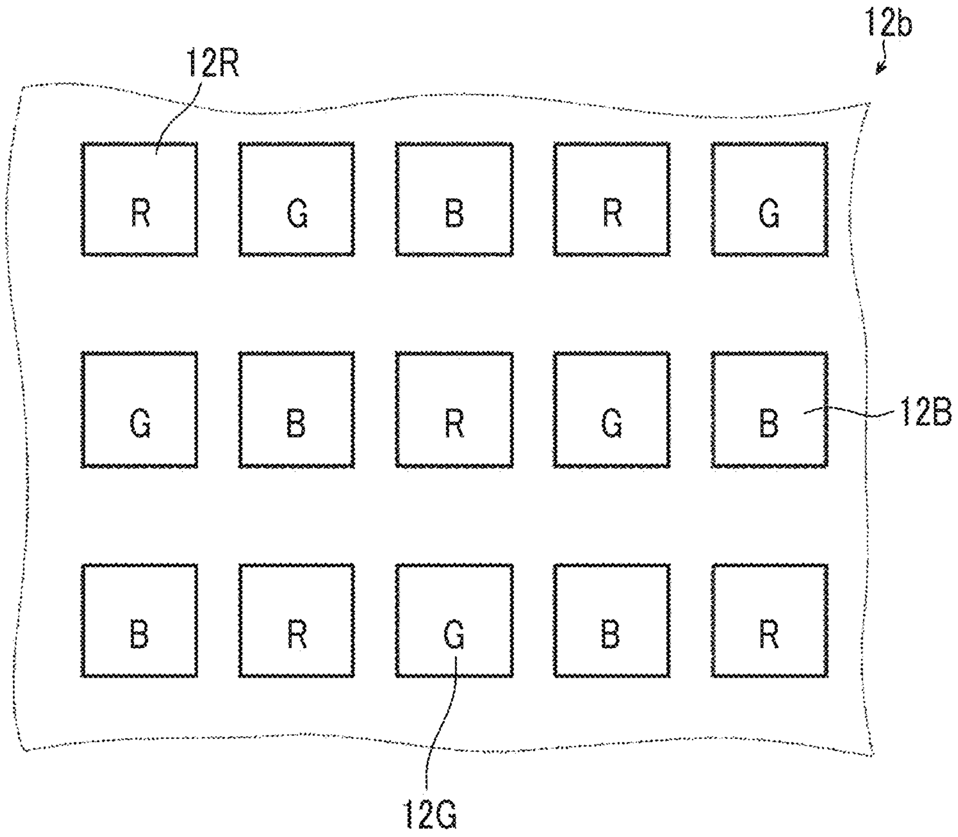
FIG. 5 is a view conceptually illustrating an example of an EL substrate used in the image display device of the present invention.

In addition, the EL substrate 12 may be formed such that the R light emitting element 12R, the G light emitting element 12G, and the B light emitting element 12B using an inorganic EL are arranged, as in an EL substrate 12*b* conceptually illustrated in FIG. 5. The inorganic EL is a so-called light emitting diode (LED).

Figure 6:
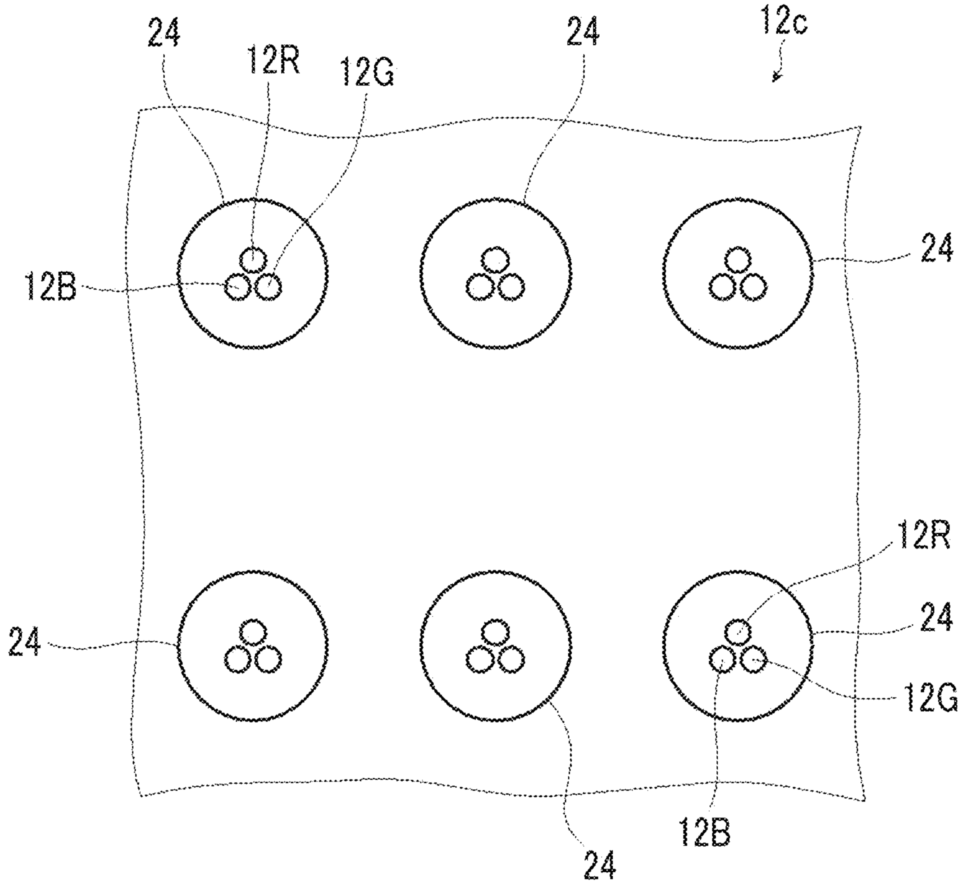
FIG. 6 is a view conceptually illustrating an example of an EL substrate used in the image display device of the present invention.

Further, the EL substrate 12 may be an EL substrate formed such that light emitting units 24 including the R light emitting element 12R, the G light emitting element 12G, and the B light emitting element 12B, which are fine inorganic EL light emitting elements, are two-dimensionally arranged, as in an EL substrate 12*c* conceptually illustrated in FIG. 6.

In the display device 10 according to the embodiment of the present invention, the area ratio of the light emitting element in the EL substrate 12 is not limited. The area ratio of the light emitting element in the EL substrate 12 is preferably 30% or less, more preferably 10% or less, still more preferably 3% or less, and even still more preferably 1% or less.

As described below, in the light absorption anisotropic film 18 of the display device 10 according to the embodiment of the present invention, it is preferable that the position of the region 18A in the light absorption anisotropic film 18 corresponds to the position of the light emitting element of the EL substrate 12. Therefore, in a case where the area ratio of the light emitting element in the EL substrate 12 is set to 30% or less, the area of the region B that contributes to the antireflection of external light is increased, the utilization efficiency of light emitted by the light emitting element is more suitably sufficiently ensured, and thus the antireflection effect of external light can be improved.

The external light reflection in the display device 10 according to the embodiment of the present invention is determined by the external light reflectivity and the area ratio thereof at each position in a screen in a case where the reflection is visually recognized from a typical viewing distance according to the display device. That is, the screen resolution of the display device 10 does not contribute to the antireflection of external light. Meanwhile, from the viewpoint of providing a display device with an excellent display quality, it is preferable that the screen resolution of the display device 10 is high.

In order to reduce the area ratio of the light emitting element in the display device 10, it is necessary to increase the output of the light emitting element to achieve sufficient brightness. From this viewpoint, it is preferable that the light emitting element in the EL substrate 12 is an inorganic EL light emitting element (so-called LED). The brightness can be sufficiently obtained by using the inorganic EL light emitting element even in a case where the area ratio of the light emitting element is set to preferably 30% or less, more preferably 10% or less, still more preferably 3% or less, and even still more preferably 1% or less.

From the viewpoint of obtaining the display device 10 in which the area ratio of the light emitting element is reduced and a high resolution and sufficient brightness are realized, it is preferable to use a fine inorganic EL light emitting element. As the fine inorganic EL light emitting element, an inorganic EL light emitting element in which the diameter of a circle inscribed in the inorganic EL light emitting element is 360 μm or less is preferable, an inorganic EL light emitting element with such a diameter of 200 μm or less is more preferable, an inorganic EL light emitting element with such a diameter of 100 μm or less is still more preferable, and an inorganic EL light emitting element with such a diameter of 50 μm or less is even still more preferable.

In one aspect, the EL substrate 12 may be a transparent substrate. Further, it is preferable that inorganic EL light emitting elements are arranged on a transparent substrate. In a case of using a transparent substrate, a display device having high designability, in which the background of the display device can be seen through and the reflection of external light on the surface of the substrate is suppressed, can be realized.

In the display device 10 in the illustrated example of the figure, the EL substrate 12 is used for displaying a full color image, which includes the R light emitting element 12R, the G light emitting element 12G, and the B light emitting element 12B, but the present invention is not limited thereto.

For example, the organic EL substrate may be used for displaying a monochrome image (monochromic image), which has only the R light emitting element 12R, only the G light emitting element 12G, or only the B light emitting element 12B. Alternatively, the organic EL substrate may be used for displaying a two-color image, which includes the R light emitting element 12R and the G light emitting element 12G, the R light emitting element 12R and the B light emitting element 12B, or the G light emitting element 12G and the B light emitting element 12B.

In the display device according to the embodiment of the present invention, a commercially available self-emission type display device (display) formed of an inorganic EL light emitting element, an organic EL light emitting element, or the like may be used as the EL substrate 12 as long as a circularly polarizing plate including an optical film (polarizer) and a λ/4 plate is not used as an antireflection layer. In addition, a commercially available display device may include a touch panel.

From the viewpoint that the effects of the present invention are excellent, it is preferable that the position of the region 18A of the light absorption anisotropic film 18 used in the present invention corresponds to the position of the light emitting element of the EL substrate 12. The expression "corresponds to the position" denotes that at least parts of the region 18A of the light absorption anisotropic film 18 and the light emitting element of the EL substrate 12 overlap each other in a case where the display device 10 in which the position of the region A of the light absorption anisotropic film and the position of the light emitting element of the image display device correspond to each other is viewed in the normal direction of the display surface, and it is preferable that the expression denotes that the region 18A of the light absorption anisotropic film 18 includes the light emitting element of the EL substrate 12.

Further, it is preferable that the center of the region 18A of the light absorption anisotropic film 18 coincides with the center (optical axis) of the light emitting element of the EL substrate 12 in a case where the display device 10 is viewed in the normal direction of the display surface. Further, it is particularly preferable that the center of the region 18A of the light absorption anisotropic film 18 coincides with the center of the light emitting element of the EL substrate 12 and that the region 18A of the light absorption anisotropic film 18 includes the light emitting element of the EL substrate 12.

As in an EL substrate 12*c* illustrated in FIG. 6, the center of the light emitting element is the center of a circle inscribed in three light emitting elements (a plurality of light emitting elements) constituting the light emitting unit 24 in a case of the EL substrate formed by arranging the light emitting units 24 including the R light emitting element 12R, the G light emitting element 12G, and the B light emitting element 12B. In this regard, the same applies to the following description for the pitch of the light emitting element and the like.

Figure 7:
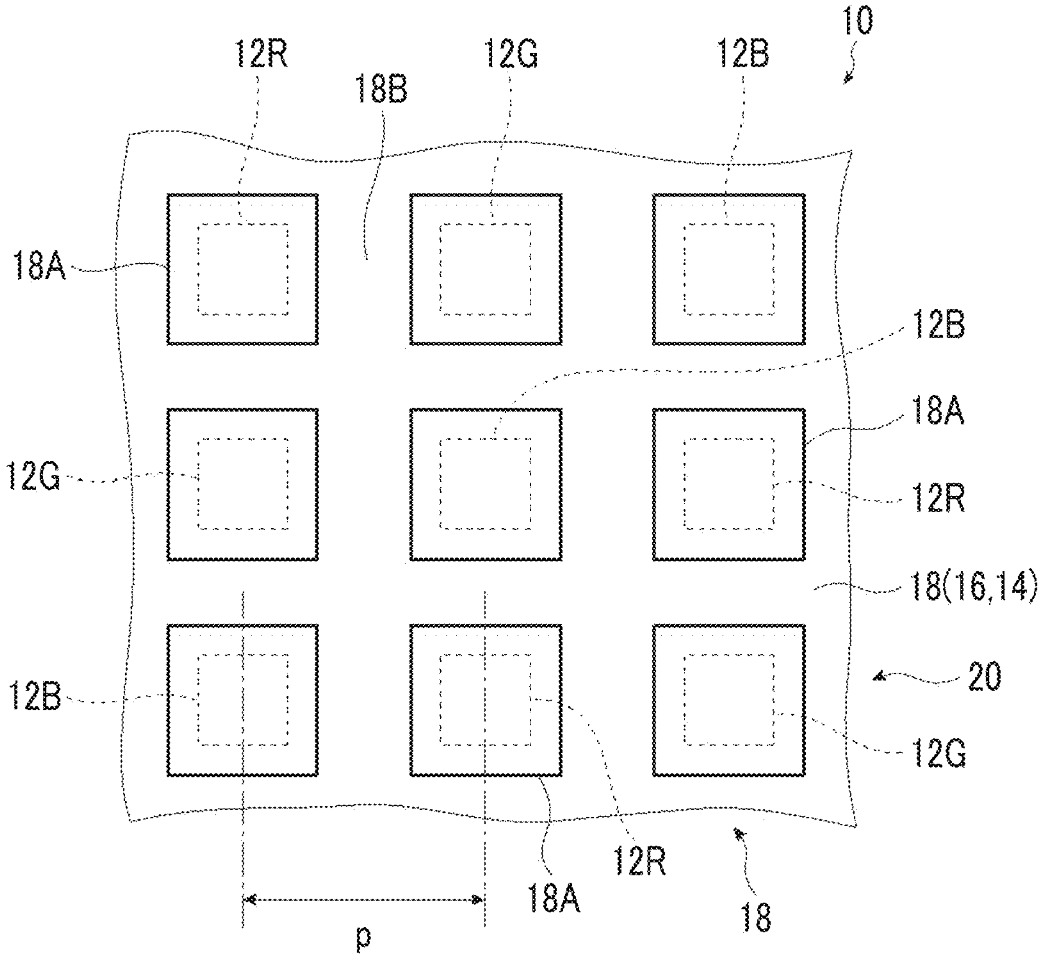
FIG. 7 is a view conceptually illustrating an example of an EL substrate used in the image display device of the present invention.

In the optical film 20 illustrated in FIG. 7, the region 18A of the light absorption anisotropic film 18 has a square shape, but the present invention is not limited thereto. That is, various shapes can be used depending on the emission characteristics of the light emitting elements, the arrangement of the light emitting elements, and the like, as the shape of the region 18A of the display device 10 in plan view. The emission characteristics of the light emitting elements are, for example, a spread angle of emitted light.

Figure 8:
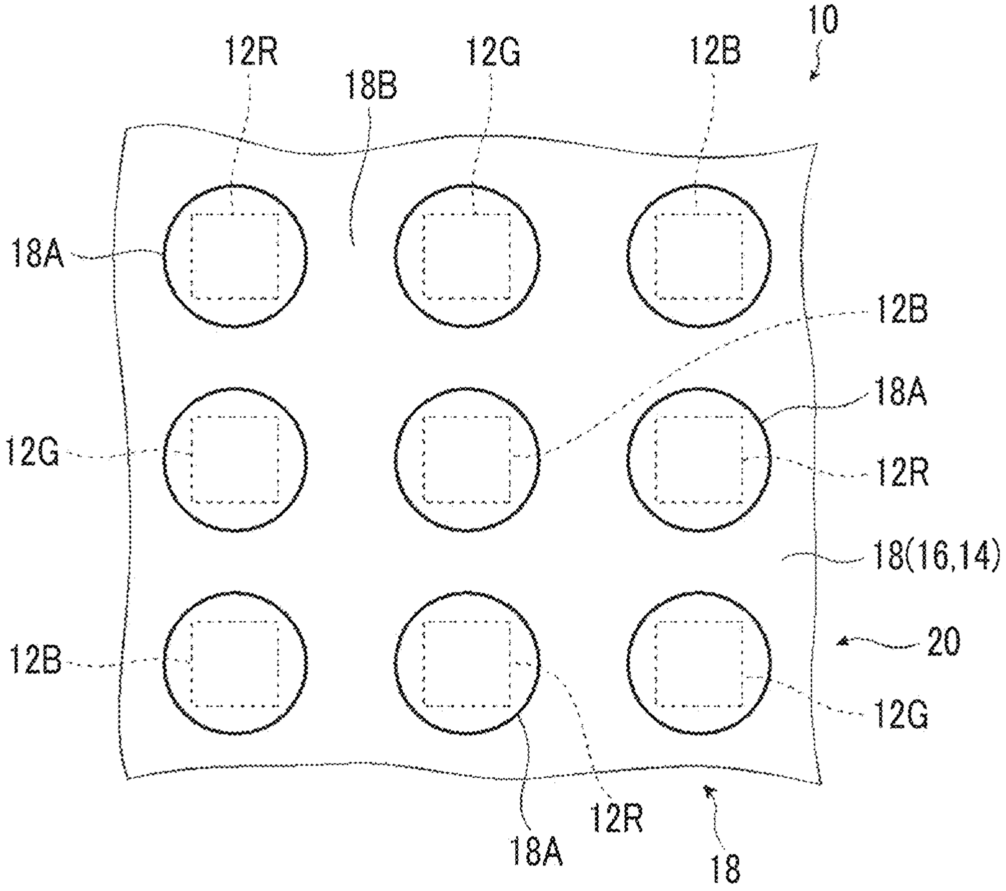
FIG. 8 is a view conceptually illustrating an example of an EL substrate used in the image display device of the present invention.

For example, as the plan view is conceptually illustrated in FIG. 8, the region 18A of the light absorption anisotropic film 18 may have a circular shape. Alternatively, the region 18A may have an elliptical shape or a triangular or pentagonal or higher polygonal shape.

In any shape, the center of the region A may be the center of the circle inscribed in the region A.

In the optical film 20 illustrated in FIG. 7, the sizes of the region 18A and the region 18B of the light absorption anisotropic film 18 are not limited, but the size of the region 18A is preferably substantially the same order as that of the light emitting element. That is, as in the size of the light emitting element described above, the diameter of the circle inscribed in the region A is preferably 360 μm or less, more preferably 200 μm or less, still more preferably 100 μm or less, and particularly preferably 50 μm or less.

The proportion of the region Ain the entire region of the light absorption anisotropic film 18 is preferably in a range of 1% to 50% and more preferably in a range of 5% to 30%.

The proportion of the region B in the entire region of the light absorption anisotropic film 18 is preferably in a range of 50% to 99% and more preferably in a range of 70% to 95%.

<Pattern Forming Method>

As described above, in the display device 10 according to the embodiment of the present invention, the light absorption anisotropic film 18 is formed such that the region 18A and the region 18B with different inclinations of the absorption axes with respect to the film surface in the same film surface are patterned.

As described above, the method of forming the light absorption anisotropic film 18 having two or more regions with different inclinations of the absorption axes in the plane is not limited, and various known methods can be used. Examples of the method include a method of controlling the thickness of the light absorption anisotropic film 18 in a plane, a method of aligning a dichroic coloring agent compound in the light absorption anisotropic film 18 using a magnetic force, and a control method of using a photo-alignment film adjacent to the light absorption anisotropic film 18.

Examples of the method of controlling the thickness of the light absorption anisotropic film 18 in the plane include a method of using imprint and a method of forming a light absorption anisotropic film on a base material having an uneven structure. Examples of the method of aligning the dichroic coloring agent compound in the light absorption anisotropic film 18 using a magnetic force include a method of forming alignment of liquid crystal compounds in any direction by applying a magnetic field. Further, examples of the control method of using a photo-alignment film adjacent to the light absorption anisotropic film 18 include a method of using lithography.

Among these, in order to form a pattern with a size of several tens of micrometers to several millimeters in accordance with the arrangement of the light emitting elements of the EL substrate 12, the control method of using a photo-alignment film adjacent to the light absorption anisotropic film 18 is preferable, and the method using lithography is particularly suitably used.

<Formation of Light Absorption Anisotropic Film Using Lithography>

Figure 9:
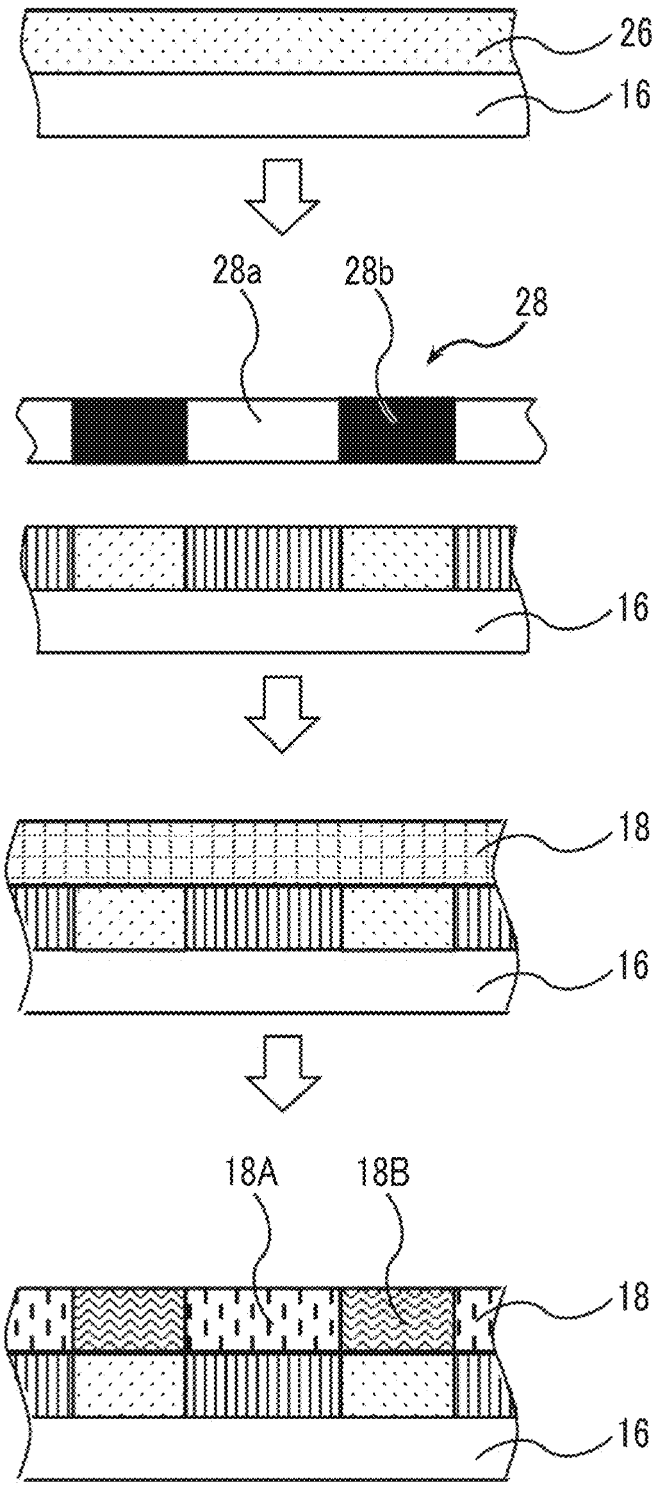
FIG. 9 is a conceptual view describing an example of a method of forming the light absorption anisotropic film used in the present invention.

FIG. 9 illustrates an example of the method of forming the light absorption anisotropic film 18 using lithography.

In a case where the light absorption anisotropic film 18 is formed by using lithography, first, a coating film 26 of the photo-alignment film described above is formed on the surface of the support 16. Next, the obtained coating film 26 is subjected to the first light irradiation. As the first light irradiation, the film surface is irradiated with linearly polarized light in a vertical direction from the upper surface or the rear surface of the coating film 26 to obtain a photo-alignment film having an alignment restricting force in the horizontal direction (the first view of FIG. 9).

Next, the obtained photo-alignment film is subjected to the second light irradiation. As the second light irradiation, the surface of the photo-alignment film is irradiated with non-polarized light in any direction. Here, as illustrated in the second view of FIG. 9, the film is irradiated with light by performing pattern exposure via a mask 28 having a pattern of a light transmitting unit 28*a* and a light shielding unit 28*b*, thereby obtaining a pattern-exposed photo-alignment film. Further, the light transmitting unit 28*a* and the light shielding unit 28*b* of the mask 28 are provided with a pattern in which the light transmitting unit 28*a* corresponds to the region 18A of the light absorption anisotropic film 18 and the light shielding unit 28*b* corresponds to the region 18B of the light absorption anisotropic film 18.

Next, a coating film 18 of the liquid crystal composition is formed on the obtained pattern-exposed photo-alignment film by performing the coating film forming step as described above (the third view in FIG. 9). Next, the liquid crystal composition in the coating film 18 is aligned by performing the aligning step, thereby forming the light absorption anisotropic film 18 having the region 18A and the region 18B with different inclinations of the absorption axes with respect to the film surface (the fourth view in FIG. 9).

In the present example, the example of the first light irradiation and the second light irradiation of the photo-alignment film corresponding to the two regions 18A and 18B has been described, but in the present invention, the film can be irradiated a plurality of times to obtain a light absorption anisotropic film having three or more different absorption axes.

Further, the irradiation amount in each light irradiation may be appropriately set according to the material for forming the light absorption anisotropic film 18 and the like so that the absorption axes of the regions 18A and 18B satisfy the target values. In this regard, the same applies to the other examples.

EXAMPLES

Hereinafter, the present invention will be described in detail based on examples. The materials, the reagents, the amounts of materials, and the proportions of the materials, the operations, and the like shown in the following examples can be appropriately changed within a range not departing from the scope of the present invention. Therefore, the present invention is not limited to the following examples.

Example 1

<<Preparation of Optical Film>>

<Preparation of Support>

A TAC base material (TG40, manufactured by FUJIFILM Corporation) having a thickness of 40 μm was continuously coated with a polymer coating solution having the following composition using a #8 wire bar. Thereafter, the base material was dried with hot air at 100° C. for 2 minutes, thereby obtaining a support in which a polyvinyl alcohol (PVA) polymer film having a thickness of 0.8 μm was formed on the TAC base material.

Further, modified polyvinyl alcohol was added to the polymer coating solution such that the concentration of solid contents was set to 4% by mass.

| Composition of polymer coating solution | |
|---|---|
| Modified polyvinyl alcohol shown below | |
| Water: | 70 parts by mass |
| Methanol: | 30 parts by mass |

Modified Polyvinyl Alcohol

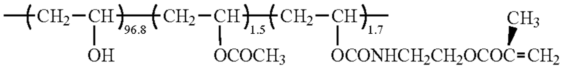

<Formation of Alignment Film>

41.6 parts by mass of butoxyethanol, 41.6 parts by mass of dipropylene glycol monomethyl ether, and 15.8 parts by mass of pure water were added to 1 part by mass of a photo-alignment material E-1 having the following structure, and the obtained solution was filtered through a 0.45 μm membrane filter under pressure, thereby preparing a coating solution for a photo-alignment film.

Next, the prepared support was coated with the obtained coating solution for a photo-alignment film and dried at 60° C. for 1 minute. Thereafter, the obtained coating film was irradiated with linearly polarized ultraviolet rays (illuminance of 4.5 mW/cm$^2$, integrated irradiation amount of 300 mJ/cm$^2$) using a polarized ultraviolet exposure device (first light irradiation), thereby preparing a photo-alignment film having an alignment restricting force in the horizontal direction. The thickness of the photo-alignment film was 50 nm.

Next, the obtained photo-alignment film was irradiated with non-polarized ultraviolet rays (illuminance of 4.5 mW/cm$^2$, integrated irradiation amount of 2,000 mJ/cm$^2$) in a direction perpendicular to the film surface via a photomask (second light irradiation), thereby preparing a pattern-exposed photo-alignment film.

Further, as the mask pattern of the mask, a mask pattern having a light shielding unit and a light transmitting unit, with the light shielding unit corresponding to a position of a light emitting element (area ratio of 25%) of the EL substrate 1 described below was used.

E-1

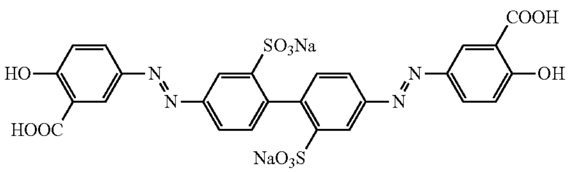

<Preparation of Light Absorption Anisotropic Film>

The obtained pattern-exposed photo-alignment film was continuously coated with a composition F1 for forming a light absorption anisotropic film having the following composition using a wire bar to form a coating layer F.

Next, the coating layer F was heated at 140° C. for 15 seconds, and the coating layer F was cooled to room temperature (23° C.).

Next, the coating layer was heated at 75° C. for 60 seconds and cooled to room temperature again.

Thereafter, the coating layer was irradiated with an LED lamp (center wavelength of 365 nm) for 2 seconds under an irradiation condition of an illuminance of 200 mW/cm$^2$, thereby preparing a light absorption anisotropic film having the region A and the region B with different inclinations of the absorption axes with respect to the film surface on the pattern-exposed alignment film. In a case where the absorption axes of the region A and the region B were measured by the method described above, the absorption axis angle θA of the regions A was 78°, and the absorption axis angle θB of the regions B was 0°. In addition, the transmittance in the absorption axis direction in the region A was 64%, and the in-plane alignment degree in the region B was 0.962. The film thickness of the light absorption anisotropic film was 2.0 μm.

The proportion of the region A in the entire region of the light absorption anisotropic film was 25%, and the proportion of the region B in the entire region thereof was 75%.

| Composition of composition F1 for forming light absorption anisotropic film | |
|---|---|
| First dichroic substance C-1 shown below: | 0.65 parts by mass |
| Second dichroic substance M-1 shown below: | 0.15 parts by mass |
| Third dichroic substance Y-1 shown below: | 0.52 parts by mass |
| Liquid crystal compound L-1 shown below: | 2.68 parts by mass |
| Liquid crystal compound L-2 shown below: | 1.15 parts by mass |
| Polymerization initiator IRGACURE OXE-02 (manufactured by BASF SE): | 0.17 parts by mass |
| Surfactant S-1 shown below: | 0.020 parts by mass |
| Cyclopentanone: | 92.14 parts by mass |
| Benzyl alcohol: | 2.36 parts by mass |

Dichroic substance C-1 (maximal absorption wavelength: 570 nm)

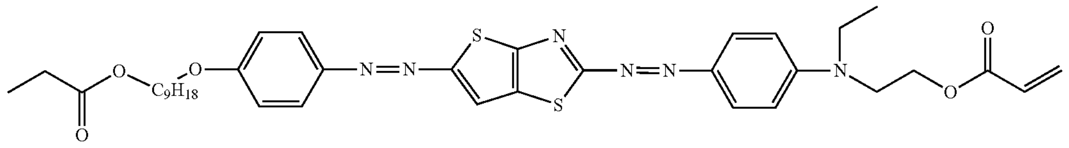
Dichroic substance M-1 (maximal absorption wavelength: 466 nm)
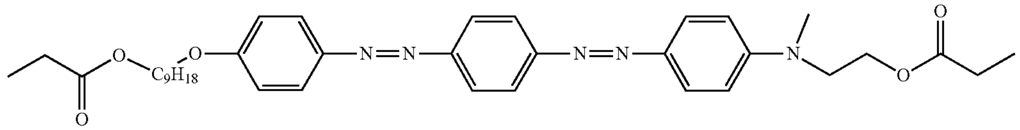
Dichroic substance Y-1 (maximal absorption wavelength: 417 nm)
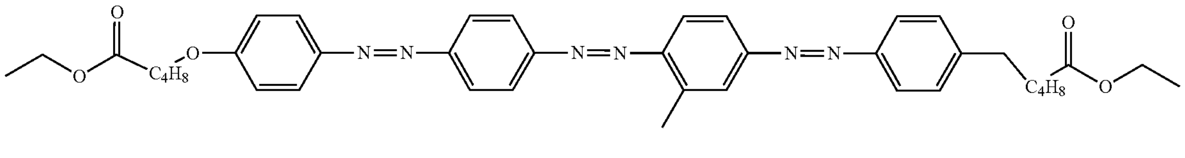
Liquid crystal compound L-1
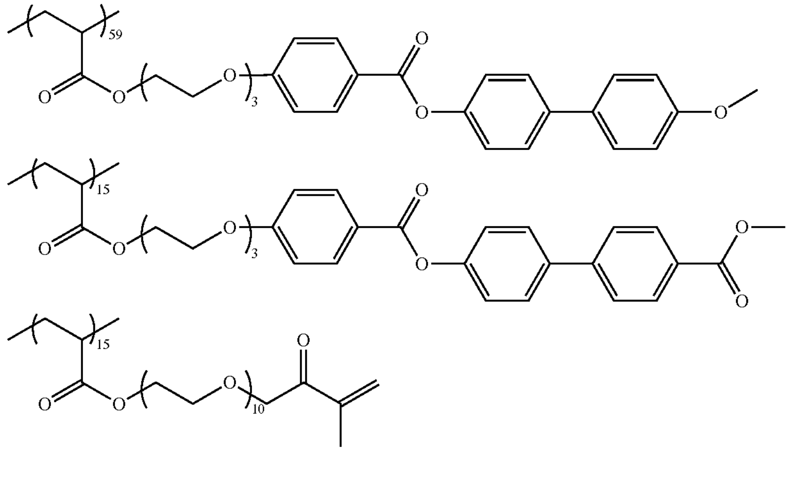
Liquid crystal compound L-2 (in the following formulae, the numerical values each represent the mass ratio)
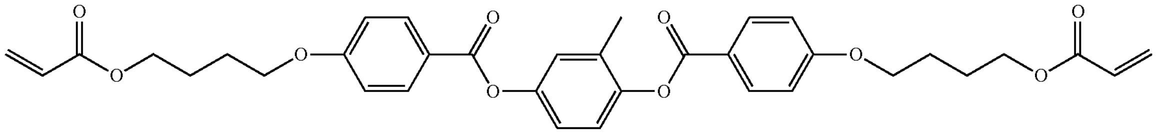
84%

-continued

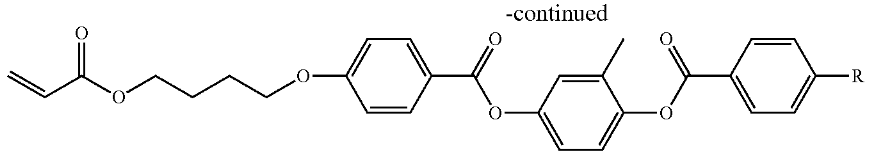

14%

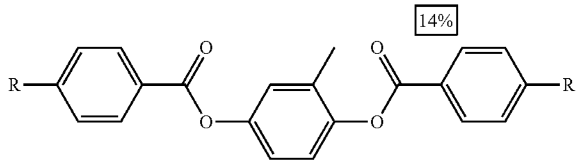

2%

R =

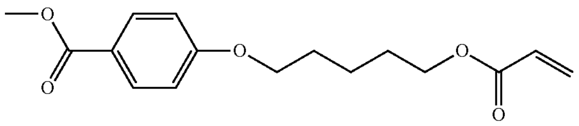

Surfactant S-1

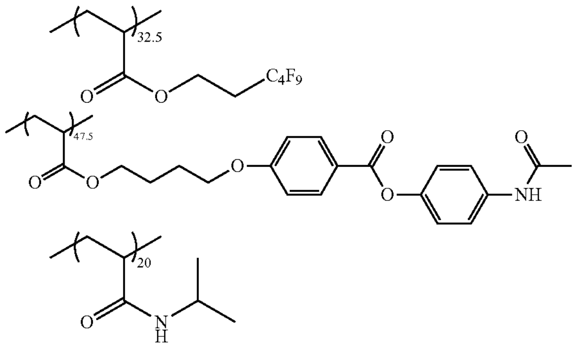

<Preparation of Oxygen Blocking Layer>

The obtained light absorption anisotropic film was continuously coated with a coating solution B1 having the following composition using a wire bar. Thereafter, the film was dried with hot air at 80° C. for 5 minutes, thereby obtaining an optical film in which the oxygen blocking layer consisting of polyvinyl alcohol (PVA) having a thickness of 1.0 μm was formed, that is, an optical film 1 in which the TAC base material (transparent support), the photo-alignment film, the light absorption anisotropic film, and the oxygen blocking layer were provided adjacent to each other in this order.

| Composition of coating solution B1 for forming oxygen blocking layer | |
|---|---|
| Modified polyvinyl alcohol shown above: | 3.80 parts by mass |
| Initiator Irg2959: | 0.20 parts by mass |
| Water: | 70 parts by mass |
| Methanol: | 30 parts by mass |

Examples 2 to 10 and Comparative Examples 1 to 4

Optical films 2 to 9 including a light absorption anisotropic film described in the examples and optical films 10 to 14 described in the comparative examples were obtained by the same method as in Example 1 except that the conditions of the second light irradiation during the formation of the alignment film and the composition for forming a light absorption anisotropic film were changed as in Table 1. The angles θA and θB of the absorption axes, the transmittance, and the alignment degree in each of the examples are as listed in Table 1.

| Composition of composition F2 for forming light absorption anisotropic film | |
|---|---|
| First dichroic substance C-1 shown above: | 0.65 parts by mass |
| Second dichroic substance M-1 shown above: | 0.15 parts by mass |
| Third dichroic substance Y-1 shown above: | 0.52 parts by mass |
| Liquid crystal compound L-1 shown above: | 2.68 parts by mass |
| Liquid crystal compound L-2 shown above: | 1.15 parts by mass |
| Polymerization initiator IRGACURE OXE-02 (manufactured by BASF SE): | 0.17 parts by mass |
| Surfactant S-1 shown above: | 0.018 parts by mass |
| Surfactant S-2 shown below: | 0.002 parts by mass |
| Cyclopentanone: | 92.14 parts by mass |
| Benzyl alcohol: | 2.36 parts by mass |

Surfactant S-2

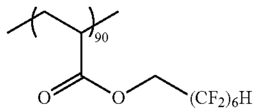

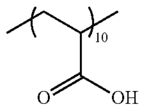

| Composition of composition F3 for forming light absorption anisotropic film | |
|---|---|
| First dichroic substance C-1 shown above: | 0.65 parts by mass |
| Second dichroic substance M-1 shown above: | 0.15 parts by mass |
| Third dichroic substance Y-1 shown above: | 0.52 parts by mass |
| Liquid crystal compound L-1 shown above: | 2.68 parts by mass |
| Liquid crystal compound L-2 shown above: | 1.15 parts by mass |
| Polymerization initiator IRGACURE OXE-02 (manufactured by BASF SE): | 0.17 parts by mass |
| Surfactant S-1 shown above: | 0.015 parts by mass |
| Surfactant S-2 shown above: | 0.005 parts by mass |
| Cyclopentanone: | 92.14 parts by mass |
| Benzyl alcohol: | 2.36 parts by mass |

| Composition of composition F4 for forming light absorption anisotropic film | |
|---|---|
| First dichroic substance C-1 shown above: | 0.65 parts by mass |
| Second dichroic substance M-1 shown above: | 0.15 parts by mass |
| Third dichroic substance Y-1 shown above: | 0.52 parts by mass |
| Liquid crystal compound L-1 shown above: | 2.68 parts by mass |
| Liquid crystal compound L-2 shown above: | 1.15 parts by mass |
| Polymerization initiator IRGACURE OXE-02 (manufactured by BASF SE): | 0.17 parts by mass |
| Surfactant S-1 shown above: | 0.012 parts by mass |
| Surfactant S-2 shown above: | 0.008 parts by mass |
| Cyclopentanone: | 92.14 parts by mass |
| Benzyl alcohol: | 2.36 parts by mass |

| Composition of composition F5 for forming light absorption anisotropic film | |
|---|---|
| First dichroic substance C-1 shown above: | 0.65 parts by mass |
| Second dichroic substance M-1 shown above: | 0.15 parts by mass |
| Third dichroic substance Y-1 shown above: | 0.52 parts by mass |
| Liquid crystal compound L-1 shown above: | 2.68 parts by mass |
| Liquid crystal compound L-2 shown above: | 1.15 parts by mass |
| Polymerization initiator IRGACURE OXE-02 (manufactured by BASF SE): | 0.17 parts by mass |
| Surfactant S-1 shown above: | 0.008 parts by mass |
| Surfactant S-2 shown above: | 0.012 parts by mass |
| Cyclopentanone: | 92.14 parts by mass |
| Benzyl alcohol: | 2.36 parts by mass |

| Composition of composition F6 for forming light absorption anisotropic film | |
|---|---|
| First dichroic substance C-1 shown above: | 0.65 parts by mass |
| Second dichroic substance M-1 shown above: | 0.15 parts by mass |
| Third dichroic substance Y-1 shown above: | 0.52 parts by mass |
| Liquid crystal compound L-1 shown above: | 2.68 parts by mass |
| Liquid crystal compound L-2 shown above: | 1.15 parts by mass |
| Polymerization initiator IRGACURE OXE-02 (manufactured by BASF SE): | 0.17 parts by mass |
| Surfactant S-2 shown above: | 0.020 parts by mass |
| Cyclopentanone: | 92.14 parts by mass |
| Benzyl alcohol: | 2.36 parts by mass |

| Composition of composition F7 for forming light absorption anisotropic film | |
|---|---|
| Dichroic substance D1 shown below | 0.8 parts by mass |
| Dichroic substance D2 shown below: | 2.6 parts by mass |
| Dichroic substance D3 shown below: | 2.2 parts by mass |
| Dichroic substance D4 shown below: | 1.8 parts by mass |
| Liquid crystal compound M1 shown below: | 100.0 parts by mass |
| Polymerization initiator IRGACURE 369 (manufactured by BASF SE): | 5.0 parts by mass |
| BYK361N (manufactured by BYK Chemie Japan Co., Ltd.): | 0.9 parts by mass |
| Cyclopentanone: | 925.0 parts by mass |

Dichroic substance D1

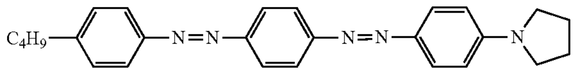

Dichroic substance D2

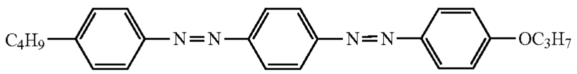

Dichroic substance D3

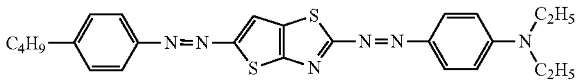

Dichroic substance D4

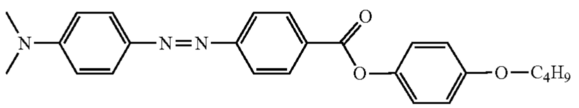

Liquid crystal compound M1 (compound A and compound B were mixed at mixing ratio of 75/25)
(Compound A)

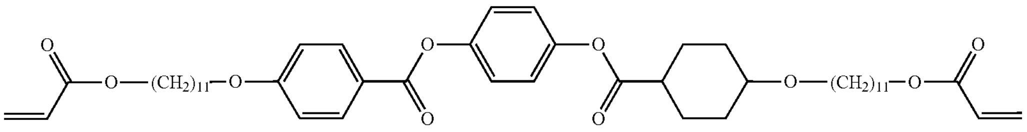

(Compound B)

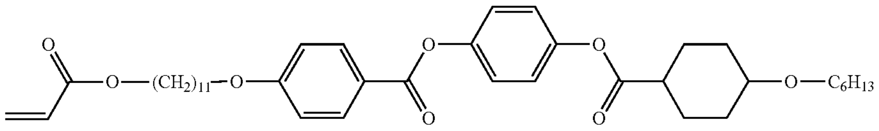

| Composition of composition F8 for forming light absorption anisotropic film | |
|---|---|
| First dichroic substance C-1 shown above: | 0.325 parts by mass |
| Second dichroic substance M-1 shown above: | 0.15 parts by mass |
| Third dichroic substance Y-1 shown above: | 0.52 parts by mass |
| Fourth dichroic substance C-2 shown below: | 0.325 parts by mass |
| Liquid crystal compound L-1 shown above: | 2.68 parts by mass |
| Liquid crystal compound L-2 shown above: | 1.15 parts by mass |
| Polymerization initiator IRGACURE OXE-02 (manufactured by BASF SE): | 0.17 parts by mass |
| Surfactant S-1 shown above: | 0.012 parts by mass |
| Surfactant S-2 shown above: | 0.008 parts by mass |
| Cyclopentanone: | 92.14 parts by mass |
| Benzyl alcohol: ` | 2.36 parts by mass |

Dichroic substance C-2 (maximal absorption wavelength: 570 nm)

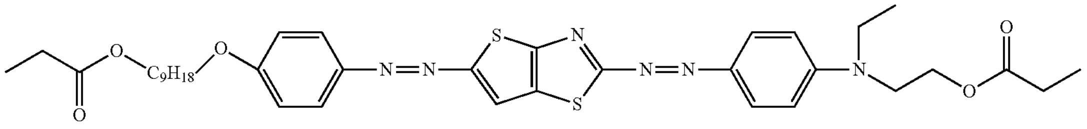

| Composition of composition F9 for forming light absorption anisotropic film | |
|---|---|
| First dichroic substance C-1 shown above: | 0.65 parts by mass |
| Second dichroic substance M-1 shown above: | 0.15 parts by mass |
| Third dichroic substance Y-1 shown above: | 0.52 parts by mass |
| Liquid crystal compound L-1 shown above: | 2.68 parts by mass |
| Liquid crystal compound L-2 shown above: | 1.15 parts by mass |
| Polymerization initiator IRGACURE OXE-02 (manufactured by BASF SE): | 0.17 parts by mass |
| Surfactant S-2 shown above: | 0.050 parts by mass |
| Cyclopentanone: | 92.14 parts by mass |
| Benzyl alcohol: | 2.36 parts by mass |

<<Preparation of Optical Laminate>>

<Preparation of λ/4 Plate>

[Preparation of Transparent Support]

<Preparation of Core Layer Cellulose Acylate Dope>

The following composition was put into a mixing tank and stirred to dissolve each component, thereby preparing a cellulose acetate solution used as a core layer cellulose acylate dope.

| Core layer cellulose acylate dope | |
|---|---|
| Cellulose acetate having acetyl substitution degree of 2.88: | 100 parts by mass |
| Polyester compound B described in example of JP2015-227955A: | 12 parts by mass |
| Compound F shown below: | 2 parts by mass |
| Methylene chloride (first solvent): | 430 parts by mass |
| Methanol (second solvent): | 64 parts by mass |

Compound F

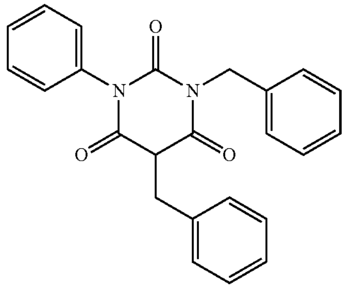 [SMILES: O=C1C(Cc2ccccc2)C(=O)N(c2ccccc2)C(=O)N1Cc1ccccc1]

(Preparation of Outer Layer Cellulose Acylate Dope)

10 parts by mass of the following matting agent solution was added to 90 parts by mass of the above-described core layer cellulose acylate dope, thereby preparing a cellulose acetate solution used as an outer layer cellulose acylate dope.

| Matting agent solution | |
|---|---|
| Silica particles with average particle size of 20 nm (AEROSIL R972, manufactured by Nippon Aerosil Co., Ltd.): | 2 parts by mass |
| Methylene chloride (first solvent): | 76 parts by mass |
| Methanol (second solvent): | 11 parts by mass |
| Core layer cellulose acylate dope described above: | 1 parts by mass |

(Preparation of Cellulose Acylate Film 1)

The core layer cellulose acylate dope and the outer layer cellulose acylate dope were filtered through filter paper having an average pore size of 34 μm and a sintered metal filter having an average pore size of 10 μm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film was peeled off in a state where the solvent content was approximately 20% by mass, both ends of the film in the width direction were fixed by tenter clips, and the film was dried while being stretched at a stretching ratio of 1.1 times in the lateral direction.

Thereafter, the film was further dried by being transported between the rolls of the heat treatment device to prepare an optical film (transparent support) having a thickness of 40 μm, and the optical film was used as a cellulose acylate film 1. The in-plane retardation of the obtained cellulose acylate film 1 was 0 nm.

[Preparation of TAC Film A1 Including Positive A-Plate A1]

The cellulose acylate film 1 was continuously coated with a coating solution PA1 for forming a photo-alignment film having the following composition using a wire bar. The support on which the coating film was formed was dried with hot air at 140° C. for 120 seconds, and the coating film was irradiated with polarized ultraviolet rays (10 mJ/cm$^2$, using an ultra-high pressure mercury lamp) to form a photo-alignment film PA1 having a thickness of 0.2 thereby obtaining a TAC film with a photo-alignment film.

| Coating solution PA1 for forming photo-alignment film | |
|---|---|
| Polymer PA-2 shown below: | 100.00 parts by mass |
| Acid generator PAG-1 shown below: | 5.00 parts by mass |
| Acid generator CPI-110TF (manufactured by San-Apro Ltd.): | 0.005 parts by mass |
| Isopropyl alcohol: | 16.50 parts by mass |
| Butyl acetate: | 1072.00 parts by mass |
| Methyl ethyl ketone: | 268.00 parts by mass |

Acid Generator PAG-1

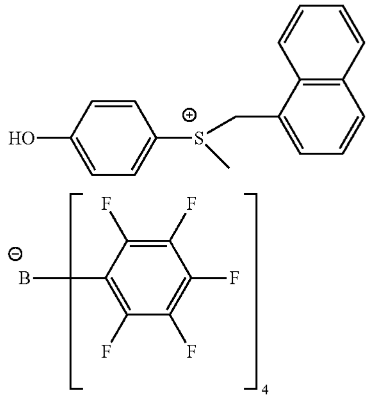

Polymer PA-1

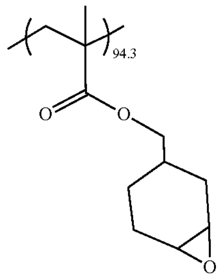

-continued

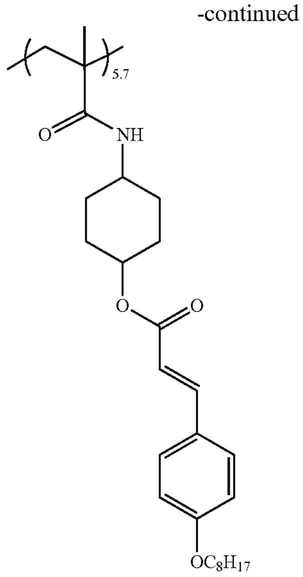

The photo-alignment film PA1 was coated with the composition A-1 having the following composition using a bar coater. The coating film formed on the photo-alignment film PA1 was heated to 120° C. with hot air, cooled to 60° C., irradiated with ultraviolet rays having a wavelength of 365 nm with an illuminance of 100 $mJ/cm^2$ using a high-pressure mercury lamp in a nitrogen atmosphere, and continuously irradiated with ultraviolet rays with an illuminance of 500 $mJ/cm^2$ while being heated at 120° C. so that the alignment of the liquid crystal compound was immobilized, thereby preparing a TAC film A1 having a positive A-plate A1.

The thickness of the positive A-plate A1 was 2.5 μm, the obtained positive A-plate A1 corresponded to a λ/4 plate, and the Re (550) was 144 nm. Further, the positive A-plate A1 satisfied the relationship of "Re(450)≤Re(550)≤Re(650)". Re(450)/Re(550) was 0.82.

| Composition A-1 | |
|---|---|
| Polymerizable liquid crystal compound LA-1 shown below: | 43.50 parts by mass |
| Polymerizable liquid crystal compound LA-2 shown below: | 43.50 parts by mass |
| Polymerizable liquid crystal compound LA-3 shown below: | 8.00 parts by mass |
| Polymerizable liquid crystal compound LA-4 shown below: | 5.00 parts by mass |
| Polymerization initiator PI-1 shown below: | 0.55 parts by mass |
| Leveling agent T-1: | 0.20 parts by mass |
| Cyclopentanone: | 235.00 parts by mass |

Polymerizable liquid crystal compound LA-1 (tBu represents tertiary butyl group)

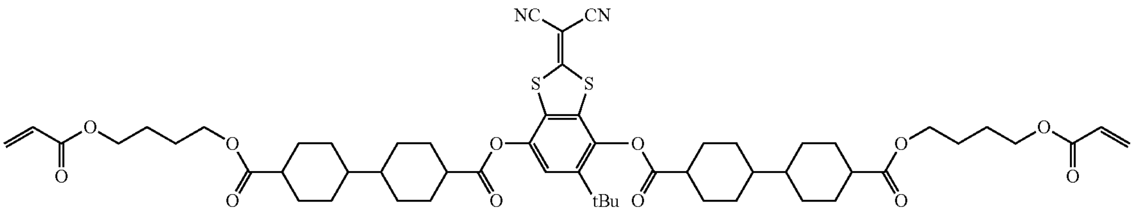 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Polymerizable liquid crystal compound LA-2

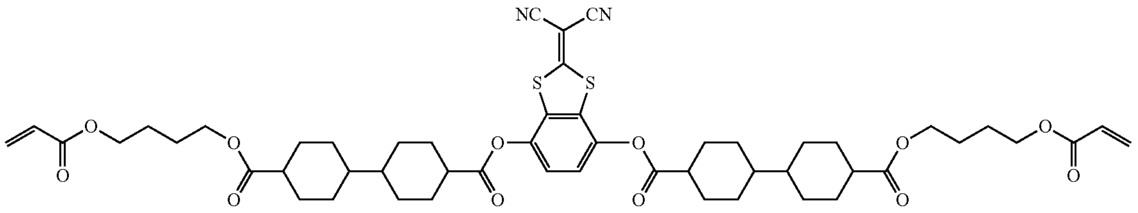 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymerizable liquid crystal compound LA-3

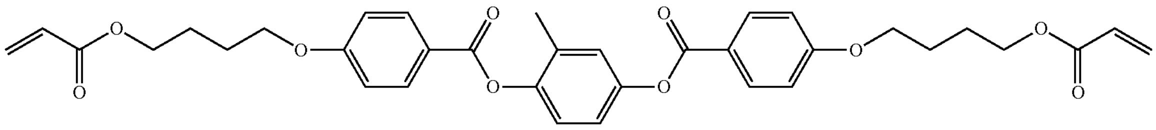 [SMILES: C=CC(=O)OCCCCOc1ccc(C(=O)Oc2ccc(OC(=O)c3ccc(OCCCCOC(=O)C=C)cc3)c(C)c2)cc1]

Polymerizable liquid crystal compound LA-4 (Me represents methyl group)

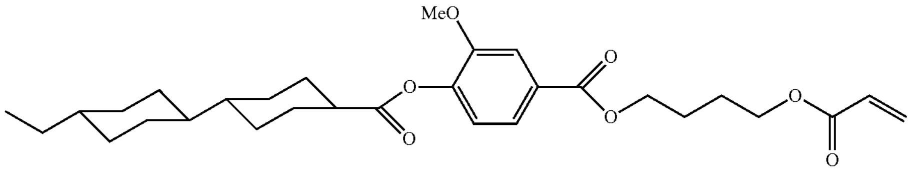 [SMILES: C=CC(=O)OCCCCOC(=O)c1ccc(OC(=O)C2CCC(C3CCC(CC)CC3)CC2)c(OC)c1]

Polymerization initiator PI-1

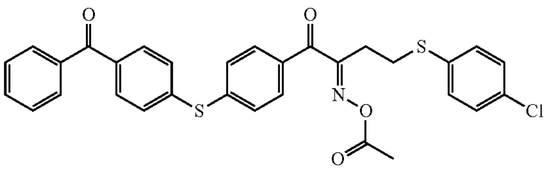 [SMILES: CC(=O)O/N=C(\CCSc1ccc(Cl)cc1)C(=O)c1ccc(Sc2ccc(C(=O)c3ccccc3)cc2)cc1]

Leveling agent T-1

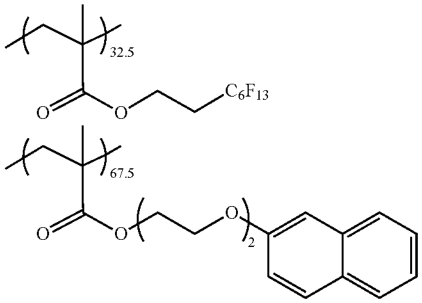

[Preparation of TAC Film C1 Having Positive C-Plate C1]

The above-described cellulose acylate film 1 was used as a temporary support.

The cellulose acylate film 1 was allowed to pass through a dielectric heating roll at a temperature of 60° C., the film surface temperature was increased to 40° C., one surface of the film was coated with an alkaline solution having the following composition such that the coating amount reached 14 ml/m$^2$ using a bar coater and heated to 110° C., and the film was transported for 10 seconds under a steam-type far-infrared heater (manufactured by Noritake Co., Ltd.).

Next, the film was coated with pure water such that the coating amount reached 3 ml/m$^2$ using the same bar coater.

Next, the process of washing the film with water using a fountain coater and draining the film using an air knife was repeated three times, and the film was transported to a drying zone at 70° C. for 10 seconds and dried, thereby preparing a cellulose acylate film 1 which had been subjected to an alkali saponification treatment.

| (Alkaline solution) | |
|---|---|
| Potassium hydroxide: | 4.7 parts by mass |
| Water: | 15.8 parts by mass |
| Isopropanol: | 63.7 parts by mass |
| Fluorine-containing surfactant SF-1 ($C_{14}H_{29}O(CH_2CH_2O)_{20}H$): | 1.0 parts by mass |
| Propylene glycol: | 14.8 parts by mass |

The cellulose acylate film 1 that had been subjected to the alkali saponification treatment was continuously coated with a coating solution PA2 for forming an alignment film having the following composition using a #8 wire bar. The obtained film was dried with hot air at 60° C. for 60 seconds and further dried with hot air at 100° C. for 120 seconds, thereby forming an alignment film PA2.

| Coating solution PA2 for forming alignment film | |
|---|---|
| Polyvinyl alcohol (PVA103, manufactured by Kuraray Co., Ltd.): | 2.4 parts by mass |
| Isopropyl alcohol: | 1.6 parts by mass |
| Methanol: | 36 parts by mass |
| Water: | 60 parts by mass |

The alignment film PA2 was coated with a coating solution C1 for forming a positive C-plate having the following composition, the obtained coating film was aged at 60° C. for 60 seconds and irradiated with ultraviolet rays with an illuminance of 1,000 mJ/cm$^2$ in the air using an air-cooled metal halide lamp at an illuminance of 70 mW/cm$^2$ (manufactured by Eye Graphics Co., Ltd.), and the alignment state thereof was immobilized to vertically align the liquid crystal compound, thereby preparing a TAC film C1 having a positive C-plate C1 with a thickness of 0.5 μm.

The Rth (550) of the obtained positive C-plate was −60 nm.

| Coating solution C1 for forming positive C-plate | |
|---|---|
| Liquid crystal compound LC-1 shown below: | 80 parts by mass |
| Liquid crystal compound LC-2 shown below: | 20 parts by mass |
| Vertically aligned liquid crystal compound S01: | 1 part by mass |
| Ethylene oxide-modified trimethylolpropane triacrylate (V#360, manufactured by Organic Chemical Industry Ltd.): | 8 parts by mass |
| IRGACURE 907 (manufactured by BASF SE): | 3 parts by mass |
| KAYACURE DETX (manufactured by Nippon Kayaku Co., Ltd.): | 1 part by mass |
| Compound B03 shown below: | 0.4 parts by mass |
| Methyl ethyl ketone: | 170 parts by mass |
| Cyclohexanone: | 30 parts by mass |

Compound B03

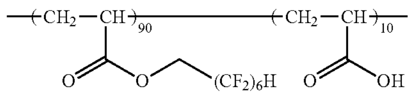

[Preparation of Pressure Sensitive Adhesive N1]

Next, an acrylate-based polymer was prepared according to the following procedures.

95 parts by mass of butyl acrylate and 5 parts by mass of acrylic acid were polymerized by a solution polymerization method in a reaction container equipped with a cooling pipe, a nitrogen introduction pipe, a thermometer, and a stirrer, thereby obtaining an acrylate-based polymer (A1) with an average molecular weight of 2,000,000 and a molecular weight distribution (Mw/Mn) of 3.0.

Next, an acrylate-based pressure sensitive adhesive was prepared with the compositions using the obtained acrylate-based polymer (A1). A separate film that had been subjected to a surface treatment with a silicone-based release agent was coated with the composition using a die coater, dried in an environment of 90° C. for 1 minute, and irradiated with ultraviolet rays (UV) under the following conditions, thereby obtaining an acrylate-based pressure sensitive adhesive N1. The composition and the film thickness of the acrylate-based pressure sensitive adhesive are shown below.

(UV Irradiation Conditions)

Electrodeless lamp H bulb (Fusion Co., Ltd.)

Illuminance of 600 mW/cm$^2$, light dose of 150 mJ/cm$^2$

The UV illuminance and the light dose were measured using "UVPF-36" (manufactured by Eye Graphics Co., Ltd.).

Liquid crystal compound LC-1

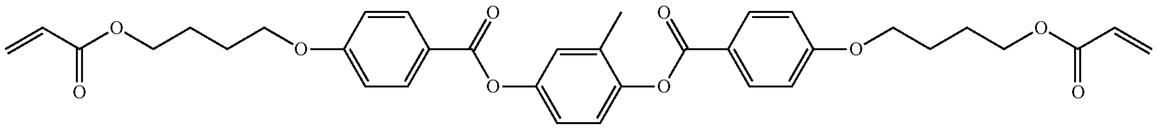 [SMILES: C=CC(=O)OCCCCOc1ccc(C(=O)Oc2ccc(OC(=O)c3ccc(OCCCCOC(=O)C=C)cc3)c(C)c2)cc1]

Liquid crystal compound LC-2

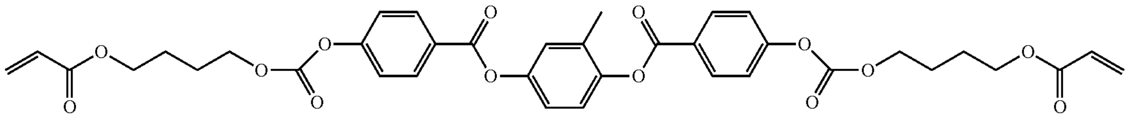 [SMILES: C=CC(=O)OCCCCOC(=O)Oc1ccc(C(=O)Oc2ccc(OC(=O)c3ccc(OC(=O)OCCCCOC(=O)C=C)cc3)c(C)c2)cc1]

Vertically aligned liquid crystal compound S01

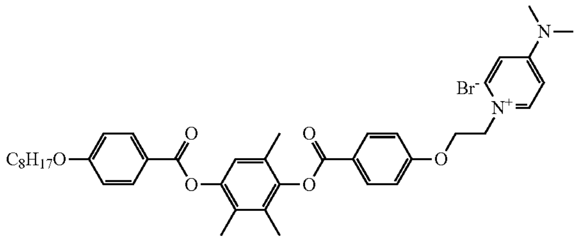

| (Acrylate-based pressure sensitive adhesive N1 (film thickness of 15 μm)) | |
|---|---|
| Acrylate-based polymer (A1): | 100 parts by mass |
| (A) Polyfunctional acrylate-based monomer shown below: | 11.1 parts by mass |
| (B) Photopolymerization initiator shown below: | 1.1 parts by mass |
| (C) Isocyanate-based crosslinking agent shown below: | 1.0 parts by mass |
| (D) Silane coupling agent shown below: | 0.2 parts by mass |

(A) Polyfunctional acrylate-based monomer: tris(acryloyloxyethyl) isocyanurate, molecular weight=423, trifunctional type (trade name, "ARONIX M-315", manufactured by Toagosei Co., Ltd.)

(B) Photopolymerization Initiator: mixture of benzophenone and 1-hydroxycyclohexyl phenyl ketone at mass ratio of 1:1, "IRGACURE 500" (manufactured by Ciba Specialty Chemicals Corp.)

(C) Isocyanate-based crosslinking agent: trimethylolpropane-modified tolylene diisocyanate ("CORONATE L", manufactured by Nippon Polyurethane Industry Co., Ltd.)

(D) Silane coupling agent: 3-glycidoxypropyltrimethoxysilane ("KBM-403", manufactured by Shin-Etsu Chemical Co., Ltd.)

[Preparation of UV Adhesive]

A UV adhesive composition having the following composition was prepared.

| UV adhesive composition | |
|---|---|
| CEL2021P (manufactured by Daicel Corporation) shown below: | 70 parts by mass |
| 1,4-Butanediol diglycidyl ether: | 20 parts by mass |
| 2-Ethylhexyl glycidyl ether: | 10 parts by mass |
| CPI-100P: | 2.25 parts by mass |

CPI-100P

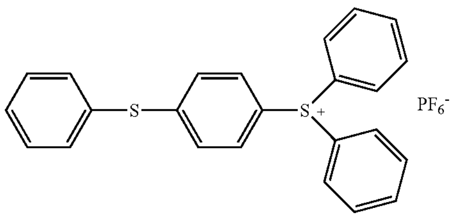

[Preparation of Optical Laminate 1]

The TAC film A1 having the positive A-plate A1 on the retardation layer side and the TAC film C1 having the positive C-plate C1 on the retardation layer side were bonded to each other by irradiation with UV rays having a light dose of 600 mJ/cm$^2$ using the UV adhesive composition. The thickness of the UV adhesive layer was 2 μm. Further, the surfaces bonded to each other with the UV adhesive were respectively subjected to a corona treatment. Next, the photo-alignment film PA1 on the positive A-plate A1 side and the cellulose acylate film 1 were removed to obtain a retardation plate 1. Further, the retardation plate 1 has a layer configuration of the positive A-plate A1, the UV adhesive layer, the positive C-plate C1, the photo-alignment film PA2, and the cellulose acylate film 1.

The optical film 1 on the oxygen blocking layer side was bonded to the low-reflection surface film CV-LC5 (manufactured by Fujifilm Corporation) on the support side using the pressure sensitive adhesive N1. Next, the resultant was allowed to stand in an environment of 25° C. and a relative humidity of 90% for 24 hours, the TAC base material and the photo-alignment film of the optical film 1 were removed, and the surface after removal and the retardation plate 1 on the positive A-plate A1 side were bonded to each other using the UV adhesive. The thickness of the UV adhesive layer was 4.45 μm. Next, the photo-alignment film PA2 on the positive C-plate C1 side and the cellulose acylate film 1 included in the retardation plate 1 were removed, thereby preparing an optical laminate 1. Here, the bonding was made such that the angle between the azimuthal angle of the absorption axis of the region B of the light absorption anisotropic film in the laminate 1 and the slow axis of the positive A-plate A1 reached 45°.

Further, the optical laminate 1 has a layer configuration of the low-reflection surface film CV-LC5, the pressure sensitive adhesive layer N1, the oxygen blocking layer, the light absorption anisotropic film, the UV adhesive layer, the positive A-plate A1, the UV adhesive layer, and the positive C-plate C1, and the total thickness of the optical film 1 (the oxygen blocking layer to the light absorption anisotropic film) and the λ/4 plate (the positive A-plate A1) was 10 μm.

[Preparation of Optical Laminates 2 to 14]

Optical laminates 2 to 14 were prepared by the same method as that for the optical laminate 1 except that the optical film used was changed to the optical films 2 to 14.

<<Evaluation>>

The results obtained by performing measurement and evaluation on each of the optical laminates prepared in the examples and the comparative examples are listed in Table 1.

<Light Utilization Efficiency>

Preparation Example 1

Three-color light emitting LEDs (PICOLED, model number: SMLP34RGB, manufactured by Rohm Co., Ltd.) were arranged on a printed circuit board in a two-dimensional lattice form such that the area ratio of the LEDs (light emitting elements) was 30%. A black layer formed of a black matrix material for a liquid crystal display device was formed in a portion where the LEDs were not arranged using photolithography. In this manner, an EL substrate 1 was prepared (see FIG. 6).

The optical laminate 1 having the optical film 1 was disposed on the EL substrate 1 such that the positive C-plate side was on the EL substrate 1 side, and the bonding was made via the pressure sensitive adhesive N1, thereby preparing a (EL) display device 1 of Preparation Example 1. During the bonding, the positions were aligned such that the region A of the light absorption anisotropic film of the prepared optical laminate and the light emitting element of the EL substrate 1 corresponded to each other.

Preparation Examples 2 to 14

Display devices 2 to 14 were prepared by the same method as in Preparation Example 1 except that the optical laminate 1 used was changed to the optical laminates 2 to 14.

The brightness was measured at a distance of 700 mm from the display surface of the prepared display device using a spectral brightness meter (SR3, manufactured by Topcon Technohouse Corporation) to measure the utilization efficiency (light utilization efficiency) of light of the light emitting element.

A display device 0 formed of an optical laminate having no light absorption anisotropic film was prepared in place of the optical laminates of Examples and Comparative Examples to measure the utilization efficiency of light of the light emitting element.

The utilization efficiency of light of the light emitting element of each display device of Preparation Examples 1 to 14 was measured based on the brightness of each display device of the examples and the comparative examples with respect to the brightness of the display device 0.

A case where the brightness with respect to the display device 0 was 80% or greater was evaluated as A, a case where the brightness with respect to the display device 0 was 70% or greater and less than 80% was evaluated as B, a case where the brightness with respect to the display device 0 was 60% or greater and less than 70% was evaluated as C, and a case where the brightness with respect to the display device 0 was less than 60% was evaluated as D.

The evaluation results are listed in Table 1.

[Measurement of Reflectivity]

The value of Y in the SCI measuring method was measured 10 times using a spectrocolorimeter (CM2022, manufactured by Konica Minolta, Inc.) at different positions in the plane, and the average value thereof was used as the reflectivity.

A case where the reflectivity was less than 2% was evaluated as A, a case where the reflectivity was 2% or greater and less than 3% was evaluated as B, a case where the reflectivity was 3% or greater and less than 4% was evaluated as C, and a case where the reflectivity was 4% or greater was evaluated as D.

The evaluation results are listed in Table 1.

In Table 1, the column of “irradiation angle” denotes the incidence angle of light in a case where the film surface was irradiated with light each time.

In Table 1, the column “transmittance” denotes the transmittance in the absorption axis direction.

In Table 1, the column “alignment degree” denotes the alignment degree in the in-plane direction of the region B.

TABLE 1

| | | Formulation/process conditions | | | | | | |
|---|---|---|---|---|---|---|---|---|
| | | Photo-alignment film | | | | | | Light absorption anisotropic layer |
| | | First light irradiation | | | Second light irradiation | | | |
| | | Irradiation light | Integrated irradiation amount | Irradiation angle | Irradiation light | Integrated irradiation amount | Irradiation angle | Liquid crystal composition |
| Example 1 | Optical film 1 | Linearly polarized light | 320 ml | 90° | Non-polarized light | 2000 ml | 90° | F1 |
| Example 2 | Optical film 2 | Linearly polarized light | 320 ml | 90° | Non-polarized light | 2000 ml | 90° | F2 |
| Example 3 | Optical film 3 | Linearly polarized light | 320 ml | 90° | Non-polarized light | 2000 ml | 90° | F3 |
| Example 4 | Optical film 4 | Linearly polarized light | 320 ml | 90° | Non-polarized light | 2000 ml | 90° | F4 |
| Example 5 | Optical film 5 | Linearly polarized light | 320 ml | 90° | Non-polarized light | 2000 ml | 90° | F5 |
| Example 6 | Optical film 6 | Linearly polarized light | 320 ml | 90° | Non-polarized light | 2000 ml | 90° | F6 |
| Example 7 | Optical film 7 | Linearly polarized light | 320 ml | 90° | Non-polarized light | 2000 ml | 60° | F4 |
| Example 8 | Optical film 8 | Linearly polarized light | 320 ml | 90° | Non-polarized light | 2000 ml | 40° | F4 |
| Example 9 | Optical film 9 | Linearly polarized light | 320 ml | 90° | Non-polarized light | 2000 ml | 60° | F7 |
| Example 10 | Optical film 10 | Linearly polarized light | 320 ml | 90° | Non-polarized light | 2000 ml | 60° | F8 |
| Comparative Example 1 | Optical film 11 | Linearly polarized light | 320 ml | 90° | | None | | F1 |
| Comparative Example 2 | Optical film 12 | | None | | Non-polarized light | 2000 ml | 90° | F1 |
| Comparative Example 3 | Optical film 13 | Linearly polarized light | 320 ml | 90° | Non-polarized light | 2000 ml | 10° | F6 |
| Comparative Example 4 | Optical film 14 | Linearly polarized light | 320 ml | 90° | Non-polarized light | 2000 ml | 90° | F9 |

TABLE 1-continued

| | | Formulation/process conditions Light absorption anisotropic layer | | | | Results | |
|---|---|---|---|---|---|---|---|
| | | Region A | | Region B | | Light | |
| | | θA | Transmittance | θB | Alignment degree | utilization efficiency | Reflectivity |
| Example 1 | Optical film 1 | 78° | 64% | 0° | 0.962 | B | A |
| Example 2 | Optical film 2 | 81° | 68% | 0° | 0.961 | A | A |
| Example 3 | Optical film 3 | 90° | 74% | 0° | 0.960 | A | A |
| Example 4 | Optical film 4 | 90° | 75% | 0° | 0.958 | A | A |
| Example 5 | Optical film 5 | 90° | 75% | 0° | 0.951 | B | B |
| Example 6 | Optical film 6 | 90° | 75% | 0° | 0.942 | B | C |
| Example 7 | Optical film 7 | 57° | 72% | 0° | 0.958 | B | A |
| Example 8 | Optical film 8 | 43° | 68% | 0° | 0.957 | C | A |
| Example 9 | Optical film 9 | 85° | 75% | 0° | 0.930 | B | C |
| Example 10 | Optical film 10 | 90° | 75% | 0° | 0.958 | A | A |
| Comparative Example 1 | Optical film 11 | — | — | 0° | 0.960 | D | A |
| Comparative Example 2 | Optical film 12 | 90° | 75% | — | — | A | D |
| Comparative Example 3 | Optical film 13 | 10° | 68% | 2° | 0.940 | D | A |
| Comparative Example 4 | Optical film 14 | 90° | 75% | 10° | 0.920 | A | D |

As listed in Table 1, the display device according to the embodiment of the present invention is capable of achieving both the utilization efficiency (light utilization efficiency) of light of the light emitting element and the antireflection function of external light.

In addition, as shown in Examples 1, 2, and 8, it was found that both the utilization efficiency and the antireflection function of external light can be suitably achieved by setting the absorption axis angle θA of the region A to 45° to 90° and both the utilization efficiency and the antireflection function of external light can be more suitably achieved by setting the absorption axis angle θA of the region A to 80° to 90°.

Further, based on the comparison between Examples 5 and 6, it was found that both the utilization efficiency and the antireflection function of external light can be more suitably achieved by setting the alignment degree in the in-plane direction of the region B to 0.950 or greater.

Figure 10:
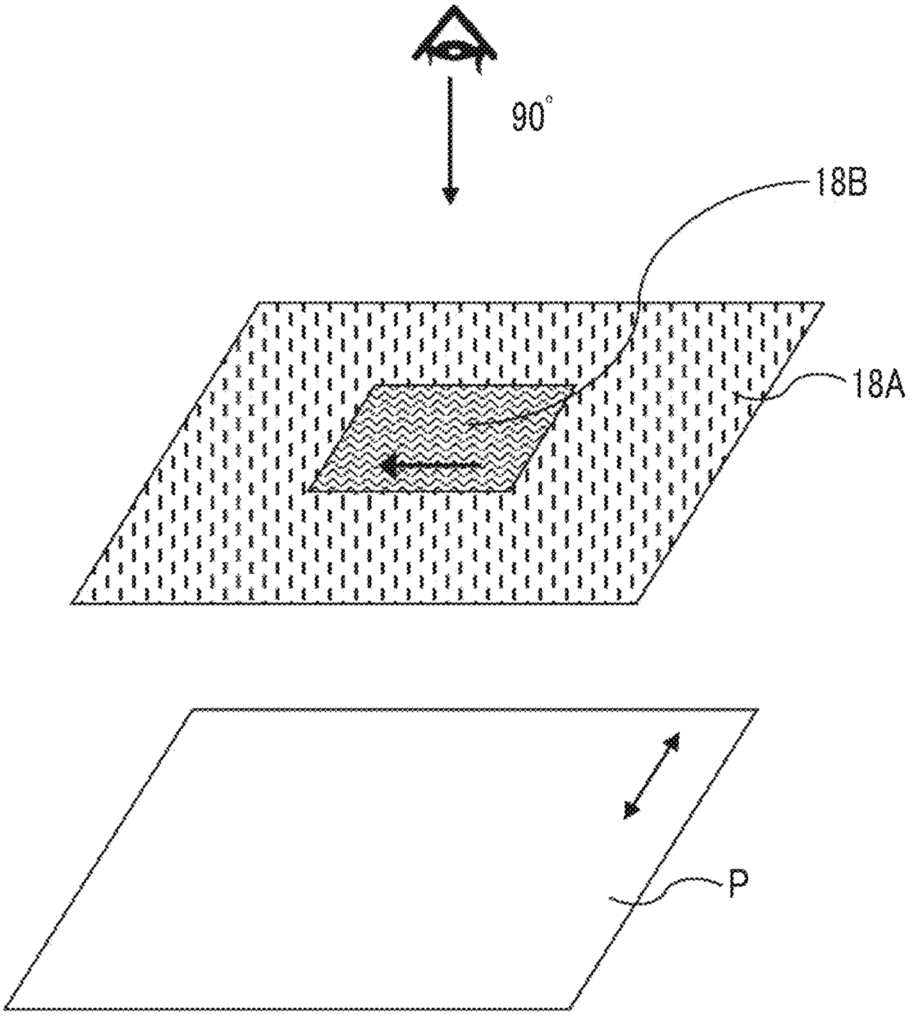
FIG. 10 is a view conceptually illustrating an example of an embodiment of the light absorption anisotropic film used in the present invention.
Figure 11:
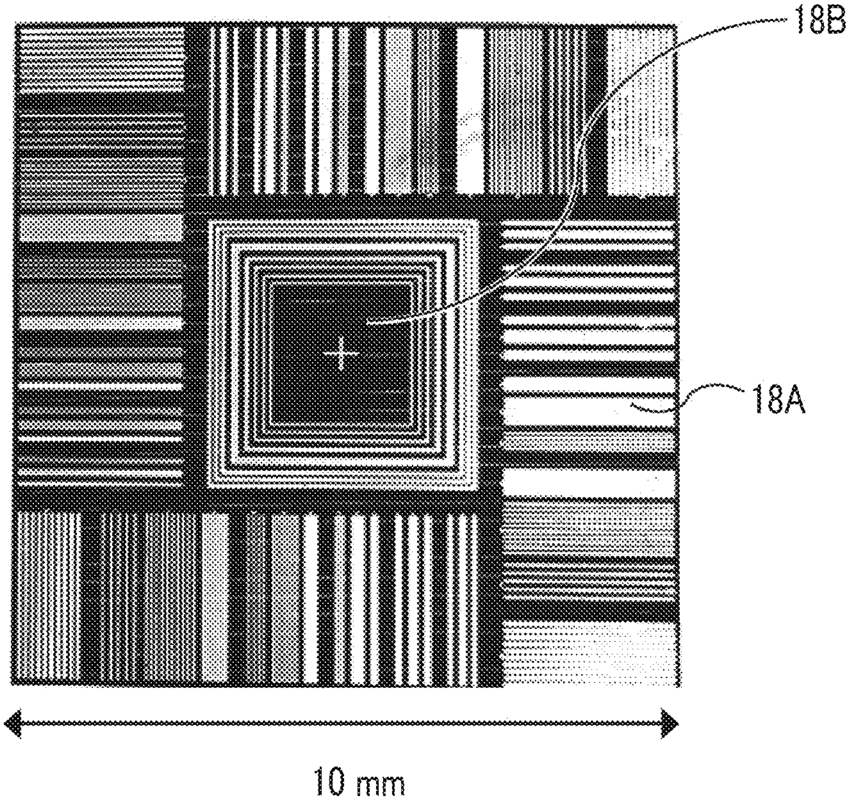
FIG. 11 is an example of a photograph illustrating the embodiment of FIG. 10.

In addition, as illustrated in FIG. 10, it was confirmed that in a case where the optical film 4 used in Example 4 was allowed to stand in an arrangement in which the absorption axis of the region 18B and the absorption axis of the linear polarizer P form crossed nicols on a schaukasten provided with the linear polarizer P and a test pattern in the optical film was observed in a vertical direction, 18A corresponding to the region A was bright and 18B corresponding to the region B was dark and visually recognizable (FIG. 11).

Figure 12:
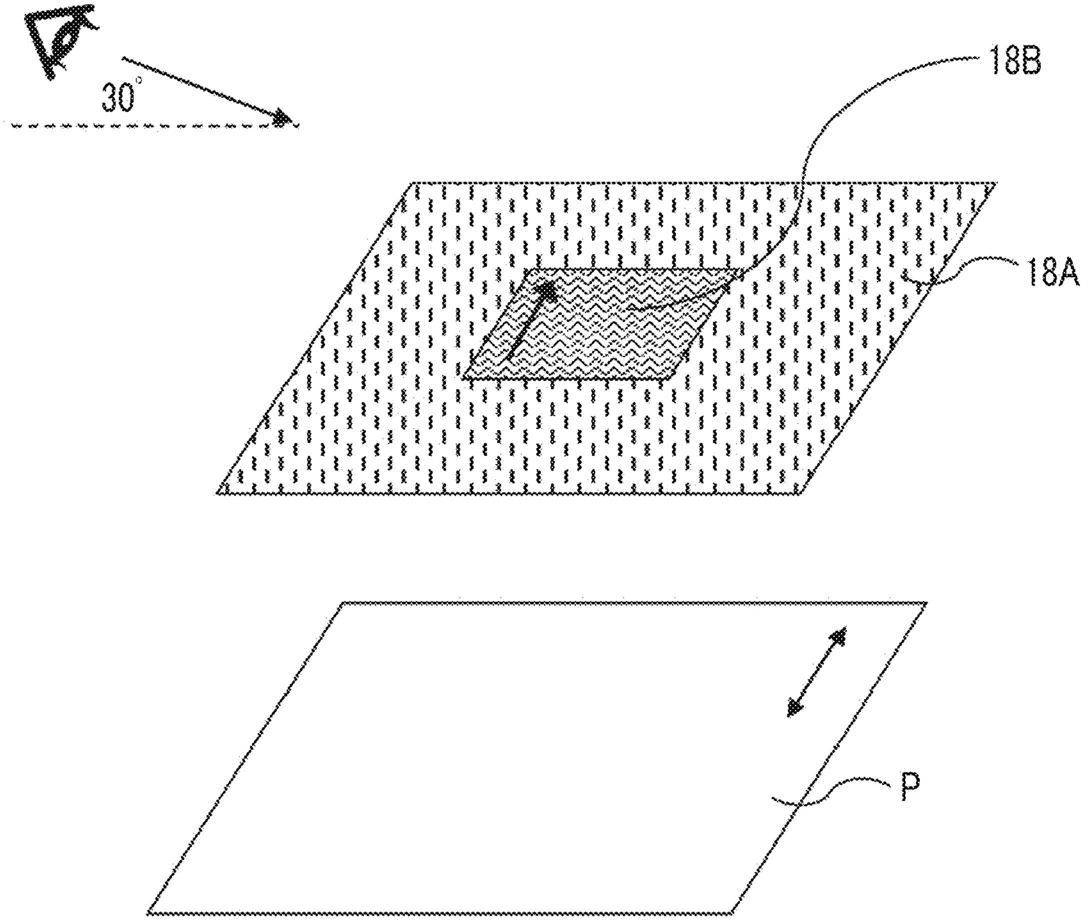
FIG. 12 is a view conceptually illustrating an example of an embodiment of the light absorption anisotropic film used in the present invention.
Figure 13:
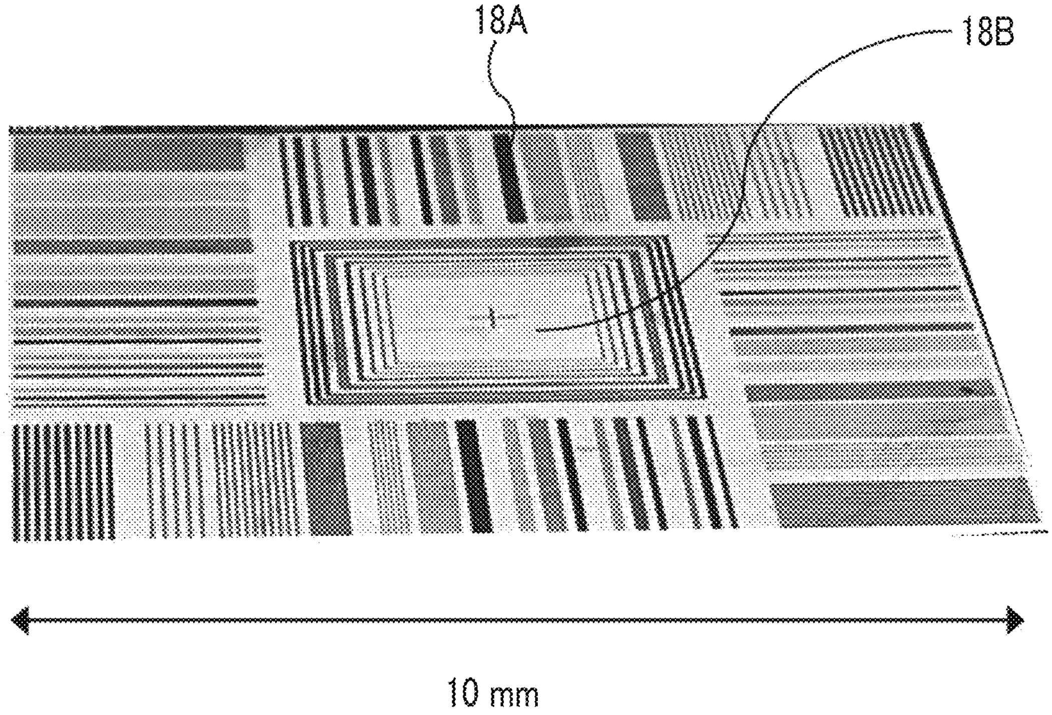
FIG. 13 is an example of a photograph illustrating the embodiment of FIG. 12.

Next, as shown in FIG. 12, it was confirmed that the identical optical film 4 was allowed to stand in an arrangement in which the absorption axis of the region 18B and the absorption axis of the linear polarizer P form parallel nicols and a test pattern in the optical film was observed at an angle of 30° from the horizontal plane, 18A corresponding to the region A was dark and 18B corresponding to the region B was bright and visually recognizable (FIG. 13). The reason for this is considered to be that the absorption axis of the region 18A and the linear polarizer P approach crossed nicols arrangement.

As shown in the observation results, the light absorption anisotropic film used in the present invention can be assumed to have, in the same film surface, the region A in which the inclination of the absorption axis with respect to the film surface is θA and the region B in which the inclination of the absorption axis with respect to the film surface is θB, θB is horizontal, and θA is close to vertical.

Although different from the effects of the present invention, an optical film in which the transmittance in the direction perpendicular to the film surface is high and the transmittance in an oblique direction is low can be formed by appropriately adjusting the film thickness of the light absorption anisotropic film and the sizes of the region A and the region B in the light absorption anisotropic film used in the present invention. Such an optical film can be expected to have a function of preventing peeping (privacy mode) into an image display device and a function of preventing reflection of light emitted from the image display device on glass in an in-vehicle display or the like, as a viewing angle control film.

The present invention can be suitably used for various display devices.

EXPLANATION OF REFERENCES

10: electroluminescence (EL) display device
12: EL substrate
12R: R light emitting element 12G: G light emitting element
12B: B light emitting element
14: λ/4 plate
16: support
18: light absorption anisotropic film
18A, 18B: region
20: optical film
24: light emitting unit
26: photo-alignment film
28: mask
28*a*: light transmitting unit
28*b*: light shielding unit
30: optical film surface
31: absorption axis

What is claimed is:

1. An optical film comprising:

a light absorption anisotropic film consisting of a cured substance of a liquid crystal composition that contains a polymerizable liquid crystal compound and a dichroic coloring agent compound, wherein the light absorption anisotropic film has, in the same film surface, a region A where an inclination with respect to normal of an absorption axis with respect to a film surface is θA and a region B where an inclination with respect to normal of an absorption axis with respect to the film surface is θB, and θA and θB satisfy relationships of Expressions (1) and (2), $$|\theta A-\theta B|\geq 10°$$ Expression (1), and $$0°\leq\theta B\leq 5°$$ Expression (2).

2. The optical film according to claim 1, wherein the inclination θA of the absorption axis is in a range of 45° to 90°.

3. The optical film according to claim 2, wherein the inclination θA of the absorption axis is in a range of 80° to 90°.

4. The optical film according to claim 2, wherein a transmittance of the region A in an absorption axis direction is 65% or greater.

5. The optical film according to claim 2, wherein an alignment degree of the region B in an in-plane direction is 0.950 or greater.

6. The optical film according to claim 2, wherein a content of the dichroic coloring agent compound is 15% by mass or greater with respect to a total mass of the light absorption anisotropic film.

7. An optical laminate which is formed by laminating the optical film according to claim 2 and a λ/4 plate.

8. An image display device comprising:

the optical film according to claim 2.

9. The image display device according to claim 8, wherein a position of the region A of the light absorption anisotropic film corresponds to a position of a light emitting element of the image display device.

10. The optical film according to claim 1, wherein the inclination θA of the absorption axis is in a range of 80° to 90°.

11. The optical film according to claim 1, wherein a transmittance of the region A in an absorption axis direction is 65% or greater.

12. The optical film according to claim 1, wherein an alignment degree of the region B in an in-plane direction is 0.950 or greater.

13. The optical film according to claim 1, wherein a content of the dichroic coloring agent compound is 15% by mass or greater with respect to a total mass of the light absorption anisotropic film.

14. An optical laminate which is formed by laminating the optical film according to claim 1 and a λ/4 plate.

15. An image display device comprising:

the optical laminate according to claim 14.

16. An image display device comprising:

the optical film according to claim 1.

17. The image display device according to claim 16, wherein a position of the region A of the light absorption anisotropic film corresponds to a position of a light emitting element of the image display device.

18. The image display device according to claim 17, wherein the image display device is an electroluminescence display device.

19. The image display device according to claim 16, wherein the image display device is an electroluminescence display device.

20. The image display device according to claim 16, wherein a total thickness of the optical film and the λ/4 plate is 20 μm or less.

* * * * *